(12) United States Patent
Yamagami et al.

(10) Patent No.: US 8,786,011 B2
(45) Date of Patent: Jul. 22, 2014

(54) SEMICONDUCTOR DEVICE

(75) Inventors: Shigeharu Yamagami, Yokohama (JP);
Tetsuya Hayashi, Yokosuka (JP);
Tatsuhiro Suzuki, Yokosuka (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 0 days.

(21) Appl. No.: 13/643,468

(22) PCT Filed: Apr. 27, 2011

(86) PCT No.: PCT/JP2011/060268
§ 371 (c)(1),
(2), (4) Date: Oct. 25, 2012

(87) PCT Pub. No.: WO2011/136272
PCT Pub. Date: Nov. 3, 2011

(65) Prior Publication Data
US 2013/0043524 A1    Feb. 21, 2013

(30) Foreign Application Priority Data

Apr. 28, 2010 (JP) ................................. 2010-102913

(51) Int. Cl.
| | | |
|---|---|---|
| H01L 29/66 | (2006.01) | |
| H01L 29/165 | (2006.01) | |
| H01L 29/10 | (2006.01) | |
| H01L 21/8234 | (2006.01) | |
| H01L 29/06 | (2006.01) | |
| H01L 29/78 | (2006.01) | |
| H01L 21/82 | (2006.01) | |
| H01L 27/07 | (2006.01) | |
| H01L 29/861 | (2006.01) | |
| H01L 29/872 | (2006.01) | |
| H01L 29/16 | (2006.01) | |
| H01L 21/04 | (2006.01) | |
| H01L 29/20 | (2006.01) | |

(52) U.S. Cl.
CPC .......... H01L 21/8213 (2013.01); H01L 29/165 (2013.01); H01L 29/1095 (2013.01); *H01L 29/1608* (2013.01); *H01L 21/046* (2013.01); *H01L 21/0485* (2013.01); *H01L 29/6606* (2013.01); H01L 21/823487 (2013.01); H01L 29/0619 (2013.01); H01L 29/7813 (2013.01); *H01L 29/1602* (2013.01); *H01L 29/2003* (2013.01); H01L 29/66068 (2013.01); H01L 27/0727 (2013.01); H01L 29/861 (2013.01); H01L 29/872 (2013.01); H01L 29/7806 (2013.01); *H01L 29/0696* (2013.01)
USPC ............ 257/328; 257/499; 257/342; 257/479

(58) Field of Classification Search
CPC .................................................... H01L 29/7813
USPC ................... 257/328, E29.255, 499, 342, 479
See application file for complete search history.

(56) References Cited

U.S. PATENT DOCUMENTS

| | | |
|---|---|---|
| 6,351,018 B1 | 2/2002 | Sapp |
| 2002/0047124 A1 | 4/2002 | Kitabatake |

(Continued)

FOREIGN PATENT DOCUMENTS

| | | | |
|---|---|---|---|
| EP | 0146962 A2 | * | 3/1985 |
| JP | 10-136642 A | | 5/1998 |
| JP | 2002-203967 A | | 7/2002 |
| JP | 2002-299625 A | | 10/2002 |
| JP | 2002-538602 A | | 11/2002 |
| JP | 2005-101514 A | | 4/2005 |
| JP | 2006-66770 A | | 3/2006 |
| JP | 2006-524432 A | | 10/2006 |
| JP | 2010-10583 A | | 1/2010 |
| KR | 10-2001-0024977 A | | 3/2001 |
| KR | 10-2005-0021258 A | | 3/2005 |
| WO | WO 2004/097944 A2 | | 11/2004 |
| WO | WO 2007/034547 A1 | | 3/2007 |

OTHER PUBLICATIONS

Korean Office Action dated Oct. 29, 2013. (6 pgs.).

*Primary Examiner* — Jarrett Stark
*Assistant Examiner* — Mohammad M Hoque
(74) *Attorney, Agent, or Firm* — Foley & Lardner LLP

(57) ABSTRACT

Each insulating gate portion forms a channel in part of a first well region located between a drift region and source region. A first main electrode forms junctions with part of the drift region exposed in the major surface of the drift region to constitute unipolar diodes and is connected to the first well regions and the source regions. The plurality of insulating gate portions have linear patterns parallel to each other when viewed in the normal direction of the major surface. Between each pair of adjacent insulating gate portions, junction portions in which the first main electrode forms junctions with the drift region and the first well regions are arranged along the direction that the insulating gate portions extend. The channels are formed at least in the normal direction of the major surface.

11 Claims, 41 Drawing Sheets

(56) References Cited

U.S. PATENT DOCUMENTS

| | | | |
|---|---|---|---|
| 2002/0195662 A1* | 12/2002 | Eden et al. | 257/349 |
| 2005/0012143 A1* | 1/2005 | Tanaka et al. | 257/328 |
| 2005/0045960 A1 | 3/2005 | Takahashi | |
| 2007/0069287 A1 | 3/2007 | Takahashi | |
| 2009/0218621 A1* | 9/2009 | Pfirsch et al. | 257/342 |
| 2009/0250750 A1 | 10/2009 | Takemori et al. | |

* cited by examiner

FIG. 22A
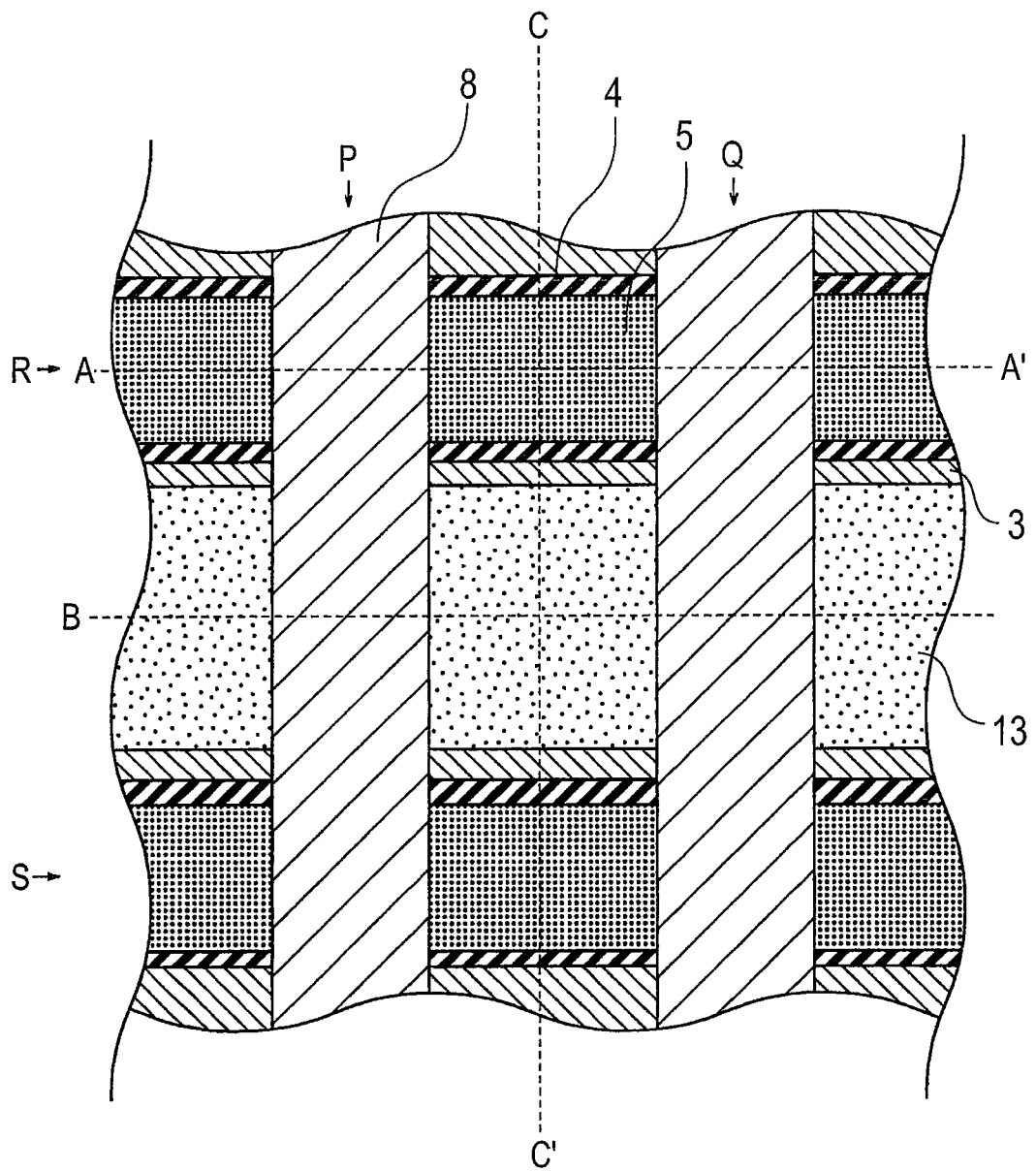
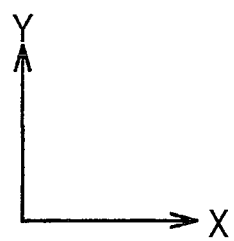

SEMICONDUCTOR DEVICE

TECHNICAL FIELD

The preset invention relates to a semiconductor device including an insulating gate transistor and a unipolar diode.

BACKGROUND ART

An example of such semiconductor devices including insulating gate transistors and unipolar diodes is a silicon carbide MOSFET described in Japanese Unexamined Patent Application Publication (Translation of PCT Application) No. 2006-524432. This publication discloses a semiconductor device in which a Schottky barrier diode (SBD) is provided in a chip including a DMOSFET (double diffused MOSFET) made of silicon carbide (SiC). The SBD has a junction barrier Schottky (JBS) structure and has a turn-on-voltage lower than that of a PN body diode included in the DMOSFET.

SUMMARY OF INVENTION

However, as shown in FIG. 2A of Japanese Unexamined Patent Application Publication (Translation of PCT Application) No. 2006-524432, between two gate contacts adjacent to each other, plural junctions in which Schottky junctions and the n-drift layer are in contact with each other, plural p+ silicon carbide regions, and two p-well regions are arrayed along the cross section shown in the drawing.

Accordingly, in order to form a Schottky barrier diode having a JBS structure between the adjacent gate contacts, a predetermined area or width is required between the adjacent gate contacts. It is therefore difficult to reduce the distances between the gate electrode portions for miniaturization of the semiconductor device.

The present invention was made in the light of the aforementioned conventional problem, and an object of the present invention is to miniaturize a semiconductor device by reducing the distances between the gate electrode portions.

The characteristic of the present invention to achieve the aforementioned object relates to a semiconductor device. The semiconductor device includes a semiconductor substrate, a drift region of first conductivity type, first well regions of second conductivity type, source regions of first conductivity type, a plurality of insulating gate portions, and a first main electrode.

The drift region is provided on the semiconductor substrate. The first well regions are provided in the drift region and are partially exposed in a major surface of the drift region. The source regions are provided in the first well regions and are partially exposed in the major surface of the drift region. The respective insulating gate portions form channels reversed to the first conductivity type in part of the first well regions located between the drift region and source regions. The first main electrode forms junctions with part of the drift region exposed in the major surface to constitute a unipolar diode and is connected to the first well regions and the source regions.

The plurality of insulating gate portions have linear patterns parallel to each other when viewed in the normal direction of the major surface of the drift region. Between each pair of adjacent insulating gate portions, junction portions at which the first main electrode forms junctions with the drift region and the first well regions are arranged along the direction that the insulating gate portions extend. The channels are formed at least in the normal direction of the major surface.

According to the present invention, it is possible to reduce the distances between adjacent insulating gate portions and thereby miniaturize the semiconductor device.

BRIEF DESCRIPTION OF DRAWINGS

FIG. 22A is a plan view illustrating a configuration of a semiconductor device according to a third embodiment of the present invention.

DESCRIPTION OF EMBODIMENTS

Figure 1:
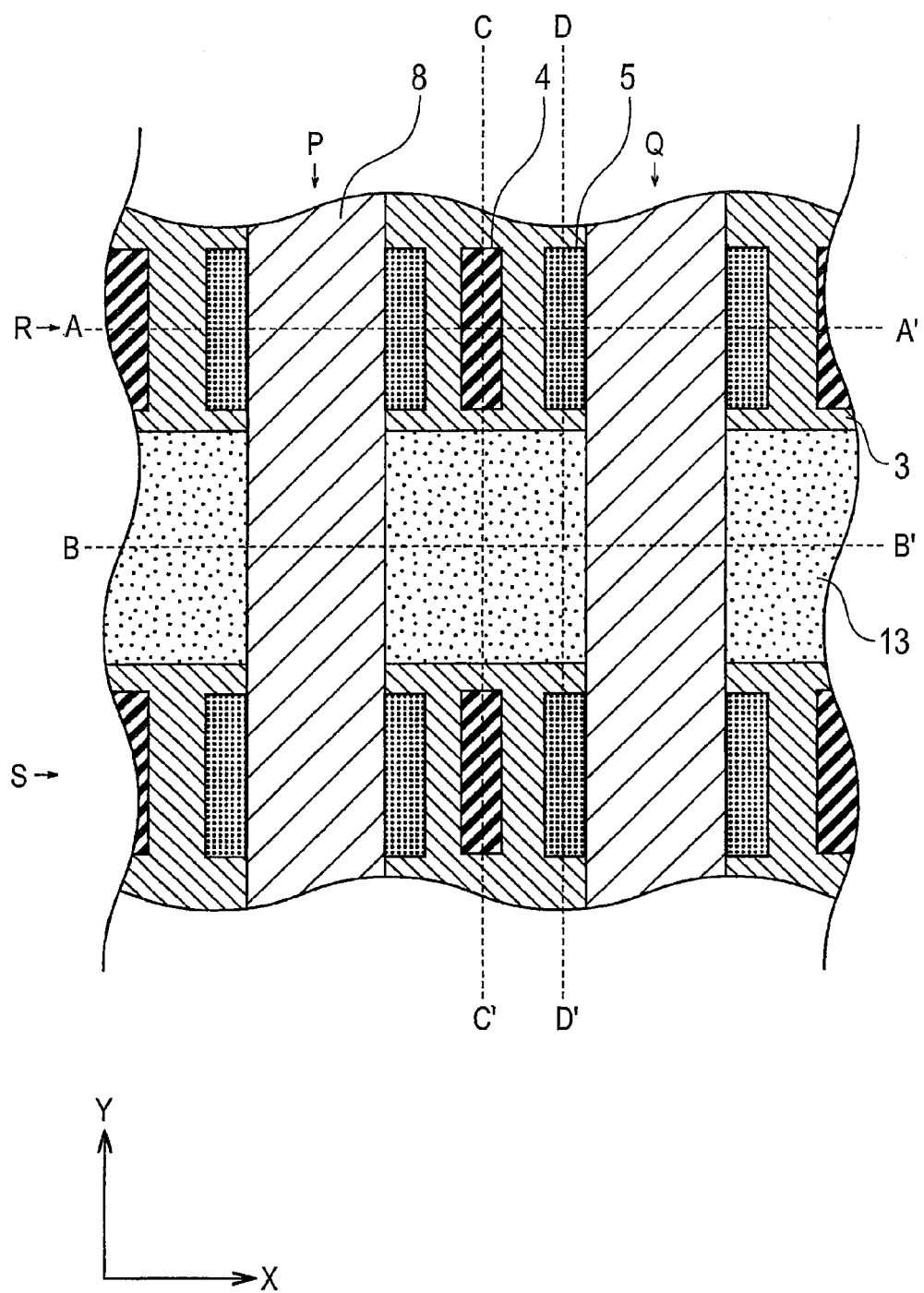
FIG. 1 is a plan view showing a configuration of a semiconductor device according to a first embodiment of the present invention.

Next, embodiments of the present invention are described with reference to the drawings. In the following description of the drawings, same or similar portions are given same or similar reference numerals. It should be noted that the drawings are schematic and that relations between thickness and width of respective regions and electrodes, proportions in thickness of regions or electrodes, and the like are different from real ones. Some portions have different dimensional relations and proportions through the drawings.

"First conductivity type" is a conductivity type opposite to "second conductivity type". The first conductivity type is n type while the second conductivity type is p type. The first conductivity type is p type while the second conductivity type is n type. In examples described in the embodiments of the present invention, the first and second conductivity types are n type and p type, respectively. Moreover, when the concentration of p type impurities added to a semiconductor is relatively high, the conductivity type thereof is represented as p+ type. When the concentration of p type impurities added to a semiconductor is relatively low, the conductivity type thereof is represented as p− type. For the n type, the conductivity type is represented as n+ or n− types in a similar manner.

First Embodiment

A description is given of a configuration of a semiconductor device according to a first embodiment of the present invention with reference to FIGS. 1, 2A, 2B, 2C, and 2D.

Figure 2A:
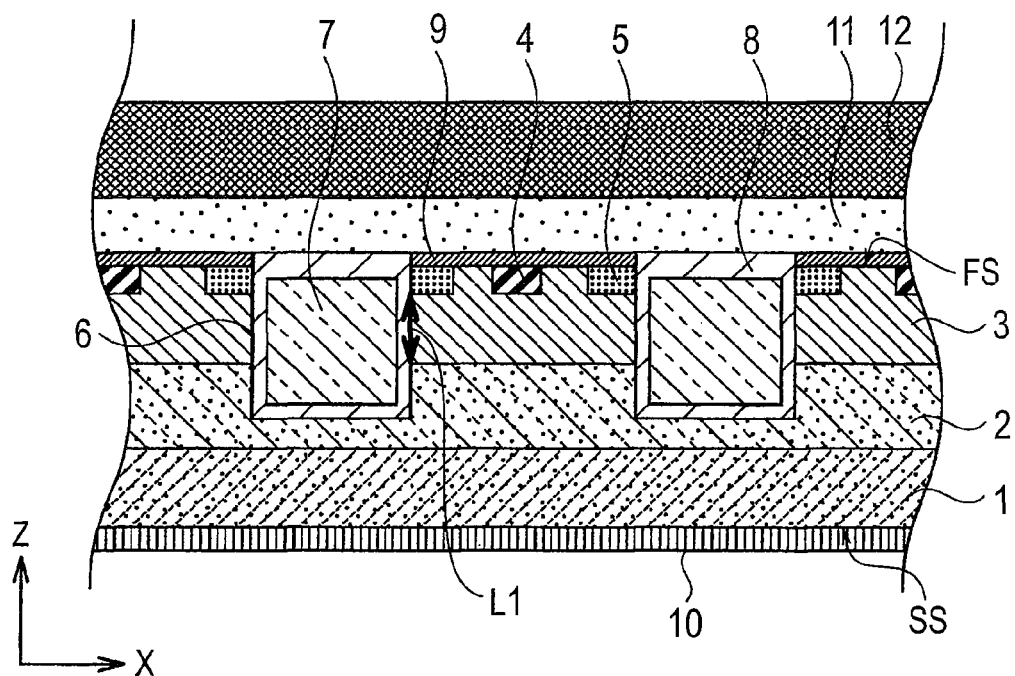
FIG. 2A is a cross-sectional view of A-A' cross section of FIG. 1.

As shown in FIG. 2A, the semiconductor device according to the first embodiment of the present invention includes: a semiconductor substrate 1 of first conductivity type (n+ type) which is made of silicon carbide (SiC); a drift region 2 of first conductivity type (n− type) provided on the semiconductor substrate 1; first well regions 3 of second conductivity type (p− type) which are provided within the drift region 2 and are partially exposed in a major surface FS of the drift region 2; source regions 5 of n+ type which are provided within the first well regions 3 and are partially exposed in the major surface FS; plural main insulating gate portions (6, 7, and 8) forming channels, which are reversed to n type, between the drift region 2 and source regions 5 in the first well regions 3; a first main electrode (9, 11, and 12) which forms Schottky junctions with part of the drift region 2 exposed in the major surface FS and is connected to the first well regions 3 and source regions 5; p+ type well contact regions 4 which are provided in different places from the source regions 5 in the first well regions 3 and are partially exposed in the major surface FS to be connected to the first main electrode (9, 11, and 12); and a second main electrode 10 which is in ohmic contact to a major surface SS of the semiconductor substrate 1. The first main electrode (9, 11, and 12) and drift region 2 constitute a Schottky barrier diode (SBD) as an example of the unipolar diode.

Each of the insulating gate portions (6, 7, and 8) includes: a gate insulating film 6 provided on an inner wall of a trench formed in the major surface FS of the drift region 2; an inter-layer insulating film 8 provided over the trench TS; and a gate electrode 7 provided within the trench surrounded by the gate insulating film 6 and inter-layer insulating film 8. The trench is formed in contact with the drift region 2, first well regions 3, and source regions 5. The gate electrode 7 is adjacent to the drift region 2, first well regions 3, and source regions 5 with the gate insulating film 6 interposed therebetween.

The first main electrode (9, 11, and 12) includes: ohmic electrodes 9, which are in ohmic contact with the well contact regions 4 and source regions 5; a Schottky electrode 11 connected to the ohmic electrode 9; and a source electrode 12 connected to the Schottky electrode 11. The first main electrode (9, 11, and 12) is connected to the first well regions 3 through the well contact regions 4.

With reference to FIG. 1, a description is given of a configuration of the semiconductor device as seen in the normal direction of the major surface FS. FIG. 1 shows an arrangement of the first well regions 3, the insulating gate portions (6, 7, and 8), Schottky junction portions 13 in which the first main electrode (9, 11, and 12) forms Schottky junction with the drift region 2, the well contact regions 4, and the source regions 5 as seen in the normal direction of the major surface FS. The first main electrode (9, 11, and 12) is not shown.

In FIG. 1, the inter-layer insulating films 8 among the insulating gate portions are exposed. The two insulating gate portions have linear patterns parallel to each other and are arranged at a given distance from each other. Under the inter-layer insulting films 8, the gate electrodes 5 shown in FIG. 2A are individually placed. For the first main electrode (9, 11, and 12) is not shown in the drawing, the drift regions 2 are seen in the Schottky junction portions 13.

The part between P and Q in FIG. 1 corresponds to a unit cell in the axis-X direction, and the part between R and S are corresponds to the unit cell in the axis-Y direction. In the other part than the range shown in FIG. 1, such unit cells are repeated in the axis-X direction and axis-Y direction.

Accordingly, when viewed in the normal direction of the major surface FS, the plural insulating gate portions (inter-layer insulating films 8) have linear patterns parallel to each other. Between each pair of insulating gate portions adjacent to each other, the Schottky junction portions 13 and first well regions 3 are alternately arrayed along the direction that the insulating gate portions extend. Taking into an account of repetition of the unit cells in the X-axis direction, the first well regions 3 and the Schottky junction portions 13 have linear patterns parallel to each other and are arranged to extend orthogonally to the direction that the insulating gate portions (inter-layer insulating films 8) extend.

The well contact regions 4 are located within the respective well regions 3, and the source regions 5 are located in regions of the first well regions 3 where the first well regions 3 are in contact with the insulating gate portions. Specifically, in each first well region 3, two of the source regions 5 are arranged so as to sandwich one of the well contact regions 4 in the direction vertical to the direction that the insulating gate portions extend (in the X direction).

As shown in FIG. 2A, on the semiconductor substrate 1, the drift region 2 is located. On the drift region 2, the first well regions 3 are located. In upper part of the first well regions 3, the well contact regions 4 and source regions 5 are located. The gate electrodes 7 and gate insulating films 6 are located inside the trenches. The trenches are in contact with the source regions 5 and the first well regions 3, which form channels, and are deeper than the first well regions 3. The bottoms of the trenches reach the drift region 2.

The well contact regions 4 and source regions 5 are in ohmic contact with the ohmic electrodes 9 with low electric resistance. On the ohmic electrodes 9, the Schottky electrode 11 is placed, and on the Schottky electrode 11, the source electrode 12 is placed. The first main electrode (9, 11, and 12), source regions 5, first well regions 3, and drift region 2 are electrically insulated from the gate electrodes 7 by the inter-layer insulating films 8 or gate insulating films 6. The second main electrode 10 is electrically connected with low resistance to the major surface SS of the semiconductor substrate 1 opposite to the drift region 2.

Figure 2B:
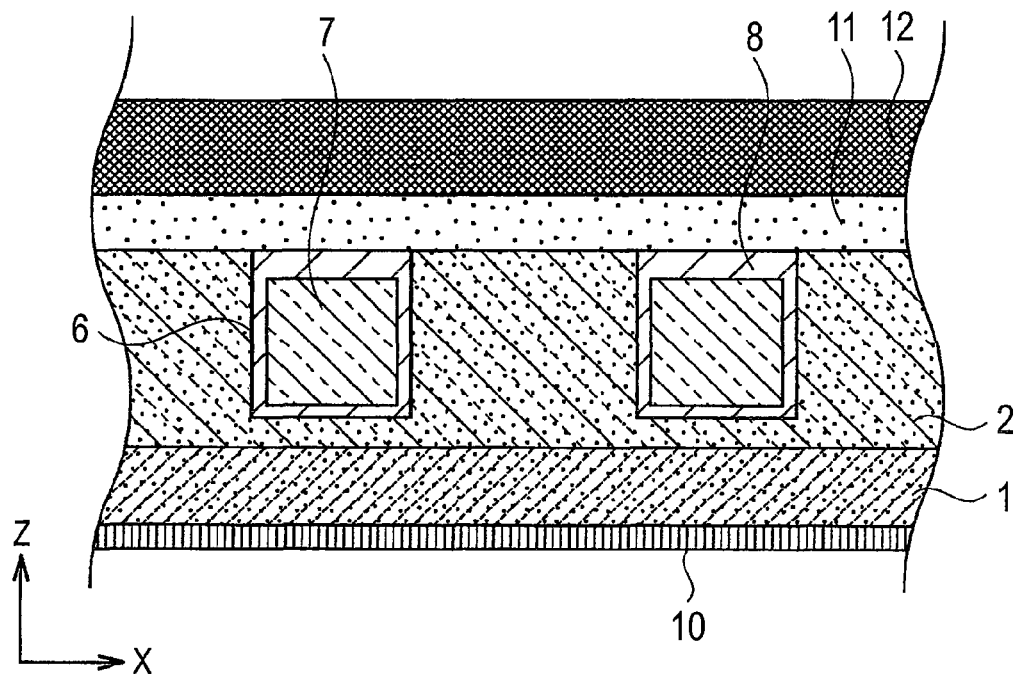
FIG. 2B is a cross-sectional view of B-B' cross section of FIG. 1.

As shown in FIG. 2B, on the drift region 2, the Schottky electrode 11 is directly placed. The drift region 2 and Schottky electrode 11 form Schottky junctions to form SBDs. The other configuration is the same as that of FIG. 2A, and the description thereof is omitted.

Figure 2C:
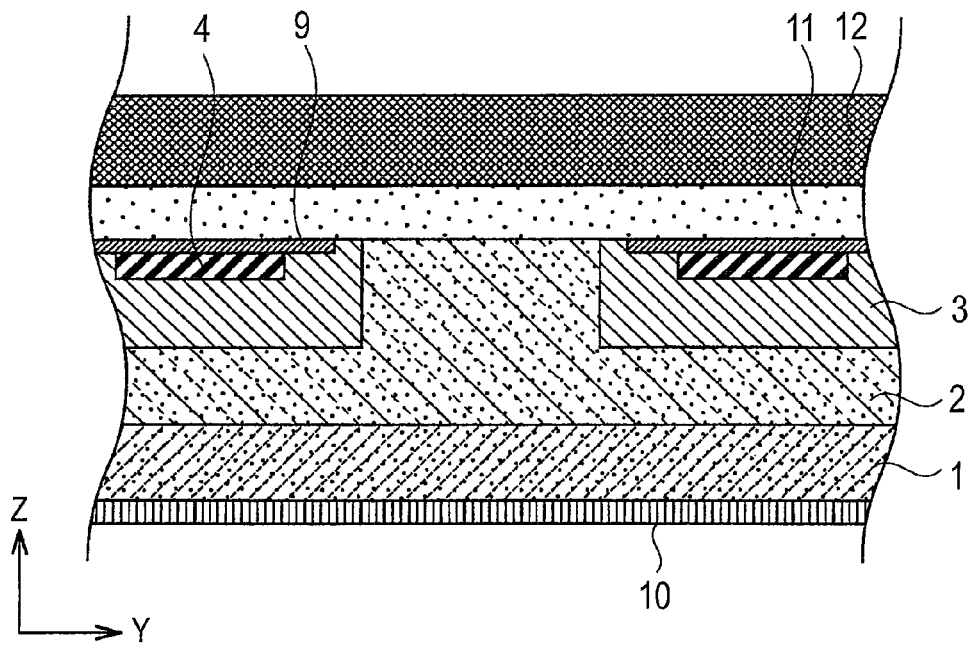
FIG. 2C is a cross-sectional view of C-C' cross section of FIG. 1.

As shown in FIG. 2C, in upper part of the drift region 2, the first well regions 3 are placed. In upper part of the first well regions 3, the well contact regions 4 are placed. On the well contact regions 4, the ohmic electrodes 9 are placed. The first well regions 3 are electrically connected to the source electrode 12 at low resistance with the well contact regions 4, ohmic electrodes 9, and Schottky electrode 11. Moreover, in each region between the adjacent first well regions 3, the drift region 2 is in contact with the Schottky electrode 11 to form a SBD.

Figure 2D:
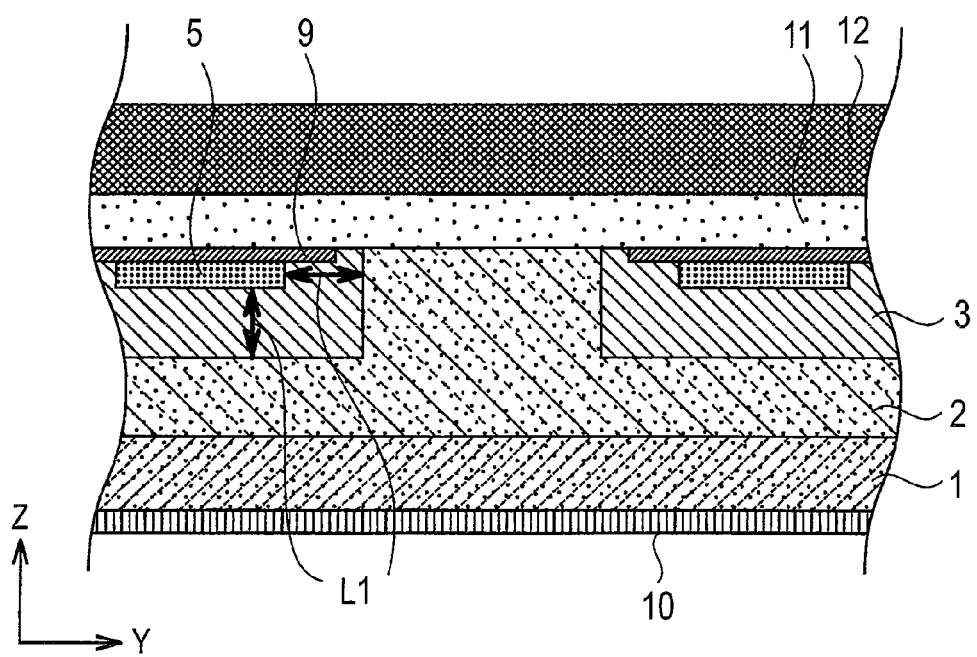
FIG. 2D is a cross-sectional view of D-D' cross section of FIG. 1.

As shown in FIG. 2D, in upper part of the first well regions 3, the source electrodes 5 are provided. On the source regions 5, the ohmic electrodes 9 are provided. The source electrodes 5 are electrically connected to the source electrode 12 at low resistance through the ohmic electrodes 9 and the Schottky electrode 11. The other configuration is the same as that of FIG. 2D, and the description thereof is omitted.

<Operation>

Next, a description is given of a basic operation of the semiconductor device shown in FIGS. 1, 2A, 2B, 2C, and 2D. Herein, the operation as a MOS electric effect transistor (MOSFET) and the operation as a Schottky barrier diode (SBD) are described.

The basic operation as a MOS field effect transistor (MOSDET) is described. A predetermined positive potential is applied to the second main electrode 10 with respect to the potential of the source electrode 12. By controlling the potential of the gate electrodes 7 in this state, the semiconductor device functions as a MOS field effect transistor (MOSFET).

Specifically, when a voltage higher than a predetermined threshold voltage is applied across each gate electrode 7 and source electrode 12, inversion layers, whose conductivity type is inverted from p type to n type, are formed in parts of the first well regions 3 which are adjacent to the gate electrodes 7 with the gate insulating films 6 interposed therebetween. As shown in FIG. 2A, since the inversion layers are formed in the parts of the first well regions 3 which are placed between the drift region 2 and source regions 5, the drift regions 2 of n type and the source regions 5 of n type are connected by the n type inversion layers (channels). The n channel-type MOSFET is therefore turned on, and positive current flows from the second main electrode 10 to the source electrode 12.

On the other hand, if the voltage applied across the gate electrodes 7 and the source electrode 12 is controlled under the predetermined threshold voltage, the n type inversion layers are not formed in the first well regions 3 in adjacent to the gate electrodes 7 with the gate insulating films 6 interposed therebetween, and the conductivity type of the parts of the first well regions 3 located between the drift region 2 and source electrodes 5 remains p type. The n channel-type MOSFET is therefore off, and the second main electrode 10 is disconnected from the source electrode 12. Accordingly, no current flows.

The channel length indicating the length of the inversion layers (channel) formed between the drift region 2 and the source region 5 are defined by arrows L1 of FIGS. 2A and 2D. As shown in FIG. 2D, the inversion layers (channels) are formed in the axis Y direction as well as in the axis Z direction to flow current. It is therefore possible to provide a MOSFET having a low electric resistance between the second main electrode 10 and the source electrode 12 when the MOSFET is on, that is, to provide a MOSFET with a low on-resistance.

When the semiconductor device operates as a MOSFET, the second main electrode 10 functions as a drain electrode.

A description is given of the basic operation as a Schottky barrier diode (SBD). In some cases, high positive voltage of several hundreds to several thousands volts is applied to the second main electrode 10 with respect to the potential of the source electrode 12 when n channel-type MOSFET is off. In such a case, the PN diode between the first well regions 3 of p− type and the drift region 2 of n− type is reverse-biased, thus allowing leak current to flow therethrough. The leak current gradually increases as the voltage increases. On the other hand, in a general SBD, leak current exponentially increases as the voltage increases, and therefore leak current is more likely to occur than at p-n junctions. However, the SBD formed between the Schottky electrode 11 and drift region 2, which is shown in FIGS. 2C and 2D, has a JBS structure. That is to say, the depletion layers extend from the first well regions 3 of p− type, which are connected to the Schottky electrode 11, in the direction Y, and the electric field at the Schottky barrier interfaces is reduced. Accordingly, compared with a general SBD, leak current when the MOSFET is off can be further reduced. As the leak current is reduced, the Schottky barrier height of the SBD can be set lower. The semiconductor device can therefore incorporate a SBD having a lower on-resistance.

The second main electrode 10 functions as a cathode electrode when the semiconductor device operates as a SBD.

Next, a description is given of operation at reflux, which is necessary for circuits such as inverters including inductance of a motor or the like as a load. At reflux, a predetermined negative potential is applied to the second main electrode 10 with respect to the potential of the source electrode 12. The semiconductor device includes a body diode (PN diode) incorporated in the MOSFET and the SBD. Moreover, for example, by selecting the Schottky electrode 11, the on-voltage of the SBD is set lower than the on-voltage of the PN diode, about 2.5 V. When the MOSFET is off, therefore, reflux current mainly flows through the SBD having a lower on-voltage. Accordingly, by providing the SBD having a lower on-voltage than the body diode, the on-voltage of the semiconductor device at reflux can be lowered, and the steady loss can be further reduced. Moreover, the SBD, which is an example of the unipolar diode, has a characteristic of having less reverse recovery charges than bipolar diodes such as PN diodes. Accordingly, it is possible to further reduce the switching loss caused at switching from the state where current is flowing through the SBD to the state where the current is shut off.

As described above, the semiconductor device, which is shown in FIGS. 1, 2A, 2B, 2C, and 2D, includes the MOS-type field effect transistor (MOSFET) as an example of the insulating gate-type transistor and the Schottky barrier diode (SBD) as an example of the unipolar diode. The SBD has a junction barrier Schottky (JBS) structure and has a turn-on-voltage lower than that of the PN body diode incorporated in the MOSFET.

<Manufacturing Method>

Next, with reference to FIGS. 3 to 20B, a description is given of a method of manufacturing the semiconductor device according to the first embodiment of the present invention.

Figure 3:
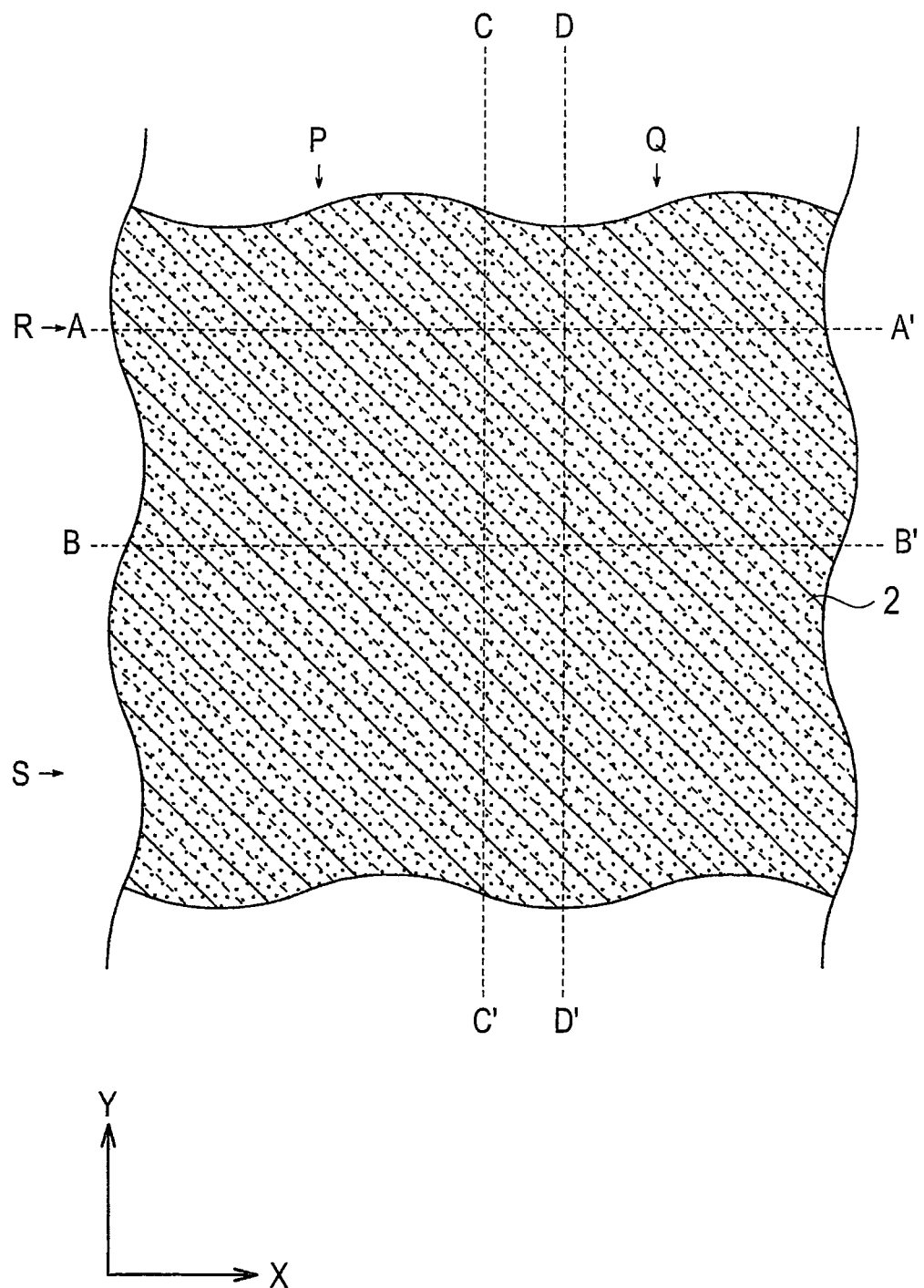
FIG. 3 is a plan view illustrating a first process of a method of manufacturing the semiconductor device according to the first embodiment of the present invention.
Figure 4:
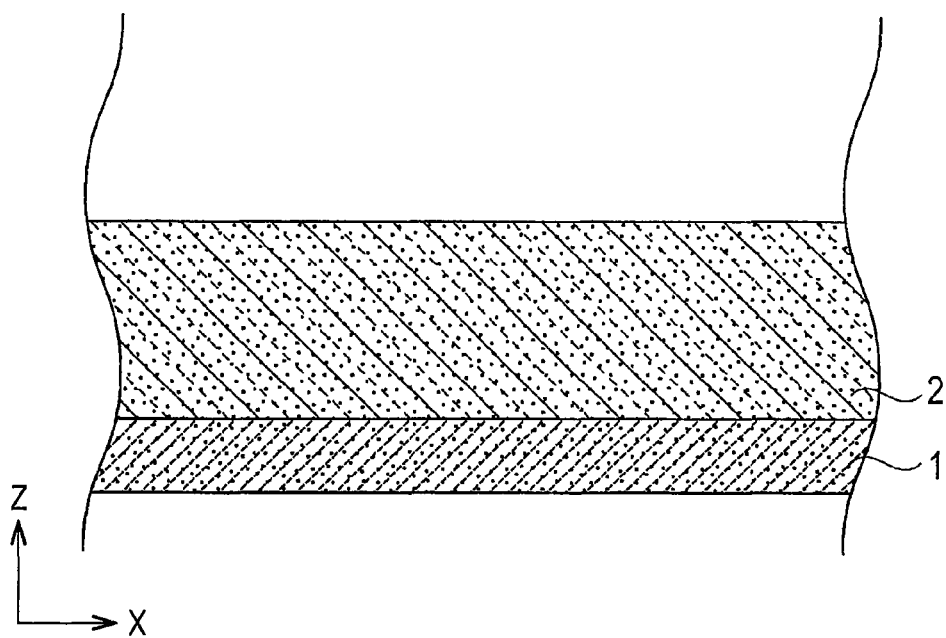
FIG. 4 is a cross-sectional view of A-A' cross section of FIG. 3.

(a) As shown in FIGS. 3 and 4, first, the semiconductor substrate 1 made of n+ type silicon carbide is prepared. Using epitaxial growth method, the drift region 2 made of n− type silicon carbide is formed on the semiconductor substrate 1 (first process). Silicon carbide is of several polytypes, and herein representative 4H silicon carbide is used.

The semiconductor substrate 1 has a thickness of about several tens to several hundreds μm, for example. The concentration of n type impurities added to the n− type drift region 2 is $10^{14}$ to $10^{18}$ cm$^{-3}$, and the thickness of the drift region 2 is several to several tens μm.

The cross-sectional configuration of B-B' cross section of FIG. 3 is the same as that of FIG. 4 and is not shown.

Figure 5:
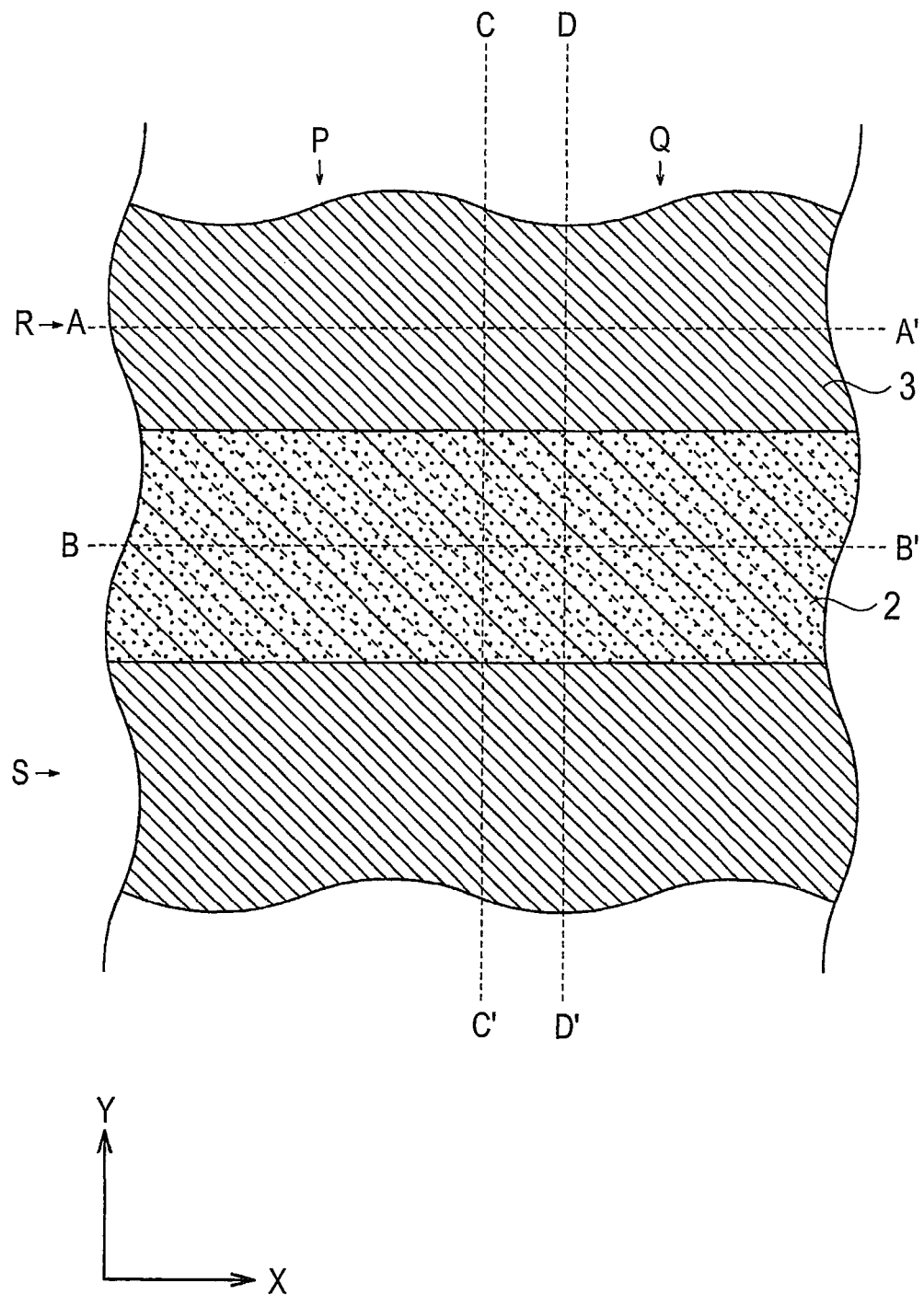
FIG. 5 is a plan view illustrating a second process of the method of manufacturing the semiconductor device according to the first embodiment of the present invention.
Figure 6:
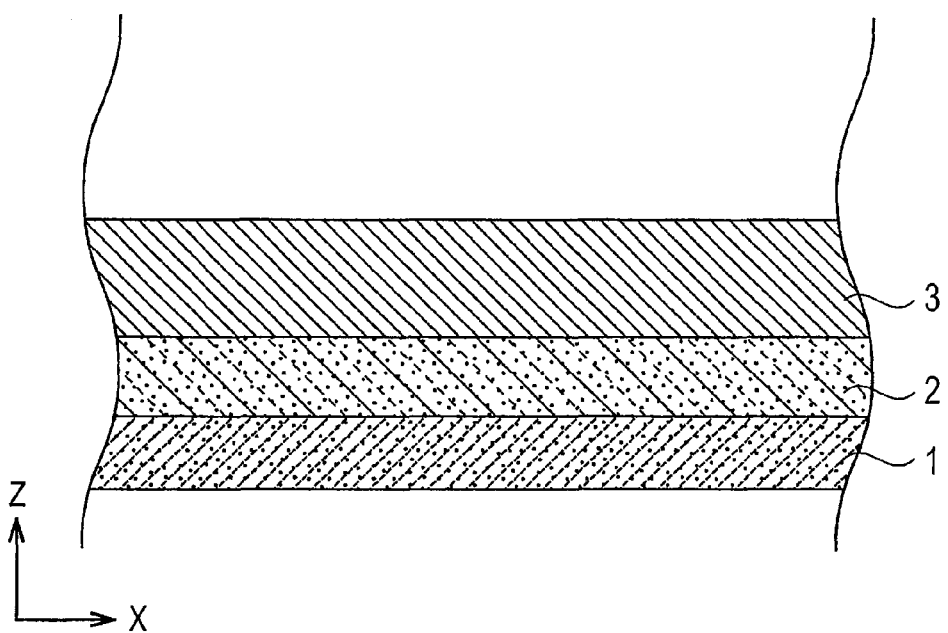
FIG. 6 is a cross-sectional view of A-A' cross section of FIG. 5.

(2) Next, as shown in FIGS. 5 and 6, the p− type first well regions 3, which are located within the drift region 2 and are partially exposed in the major surface of the drift region 2, are formed (second process).

Specifically, first, an insulating film as a mask material is deposited on the drift layer 2. The insulating film can be a silicon oxide film, and the deposition can be performed by thermal CVD or plasma CVD. Next, on the insulating film, a resist pattern corresponding to linear patterns of the first well regions 3 is formed. The resist can be patterned by a general photolithography process.

Next, the insulating film is etched by using the resist pattern as a mask to form an insulating film pattern. The etching can be wet etching using hydrofluoric acid or dry etching such as reactive ion etching (RIE). Next, the resist pattern is removed by oxygen plasma, sulfuric acid, or the like. Next, using the insulating film pattern as a mask, p type impurity ions are implanted into the major surface of the drift region 2, thus forming the p− type first well regions 3.

The p type impurities can be aluminum (Al) or boron (B). The impurity ions are implanted after the semiconductor substrate 1 is heated to a temperature of about 600° C. This can prevent crystal defects from occurring in the regions into which the ions are implanted. After the ion implantation, the insulating film is removed by wet etching using fluoric acid, for example. The depth of the p− type first well regions 3 needs to be less than the n− type drift region 2 and can be several tenths to several μm.

As shown in FIGS. 5 and 6, in the second process, the first well regions 3 are formed into linear patterns parallel to the X-axis direction. In this event, by setting the distances between the adjacent first well regions 3 to a predetermined value, the effect of the so-called JBS structure on reducing the electric field at the junction interfaces can be obtained. The distances between the adjacent first well regions 3 can be several tenths to several tens μm.

The cross-sectional configuration of the B-B' cross-section of FIG. 5 is the same as that of FIG. 4 and is not shown in any drawing.

Figure 7:
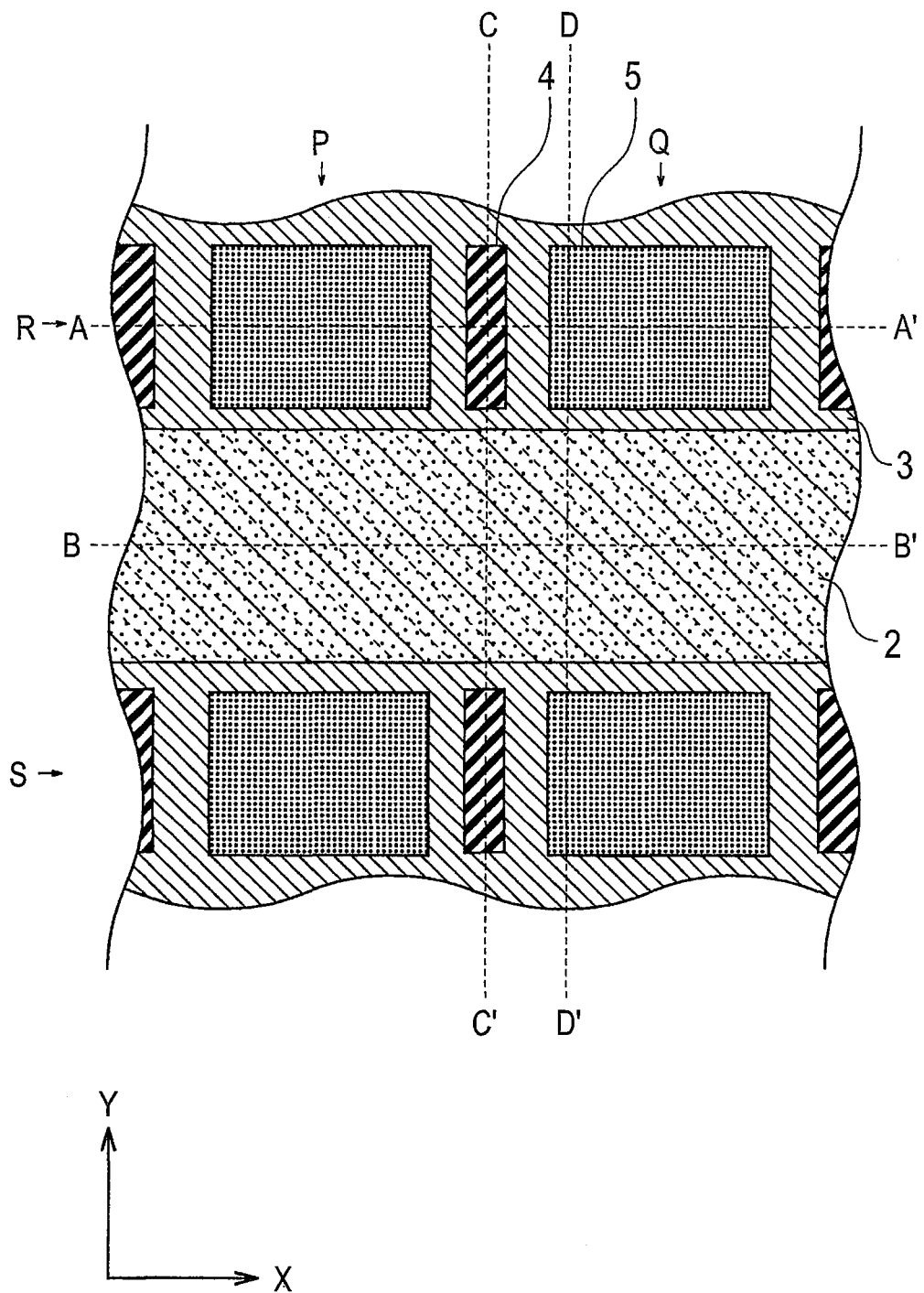
FIG. 7 is a plan view illustrating a third process of the method of manufacturing the semiconductor device according to the first embodiment of the present invention.
Figure 8:
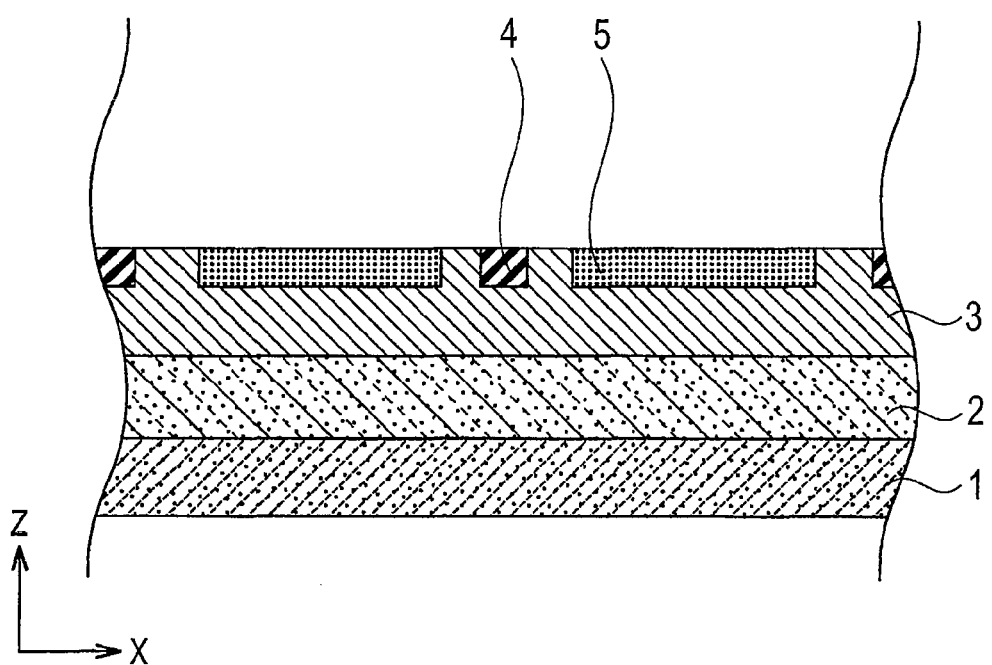
FIG. 8 is a cross-sectional view of A-A' cross section of FIG. 7.

(3) Next, as shown in FIGS. 7 and 8, the p+ type well contact regions 4 and n+ source regions 5, which are located within the first well regions 3 and are partially exposed in the major surface FS, are formed (third process). Specifically, in a similar manner to the aforementioned first process, by repeating twice formation of an insulating film as a mask material, patterning of the insulating film, impurity ion implantation, and removal of the mask, the well contact regions 4 of p+ type and the source regions 5 of n+ type are formed within the first well regions 3. The well contact regions 4 and source regions 5 may be formed in any order.

The impurity ions implanted to form the well contact regions 4 of p+ type can be aluminum or boron. The impurity ions implanted to form the source regions 5 of n+ type can be nitrogen (N) or phosphor (P). The depths of the well contact regions 4 and source regions 5 need to be less than that of the first well regions 3 and can be several tenths to several μm.

The cross-sectional configuration of the B-B' cross-section of FIG. 7 is the same as that of FIG. 4 and is not shown.

(4) Next, heat treatment is performed for the entire semiconductor substrate 1 to simultaneously activate the impurities ion-implanted in the second and third processes (fourth process). The temperature of the heat treatment can be about 1700° C., and the atmosphere thereof can be argon (Ar) or nitrogen (N).

Figure 9:
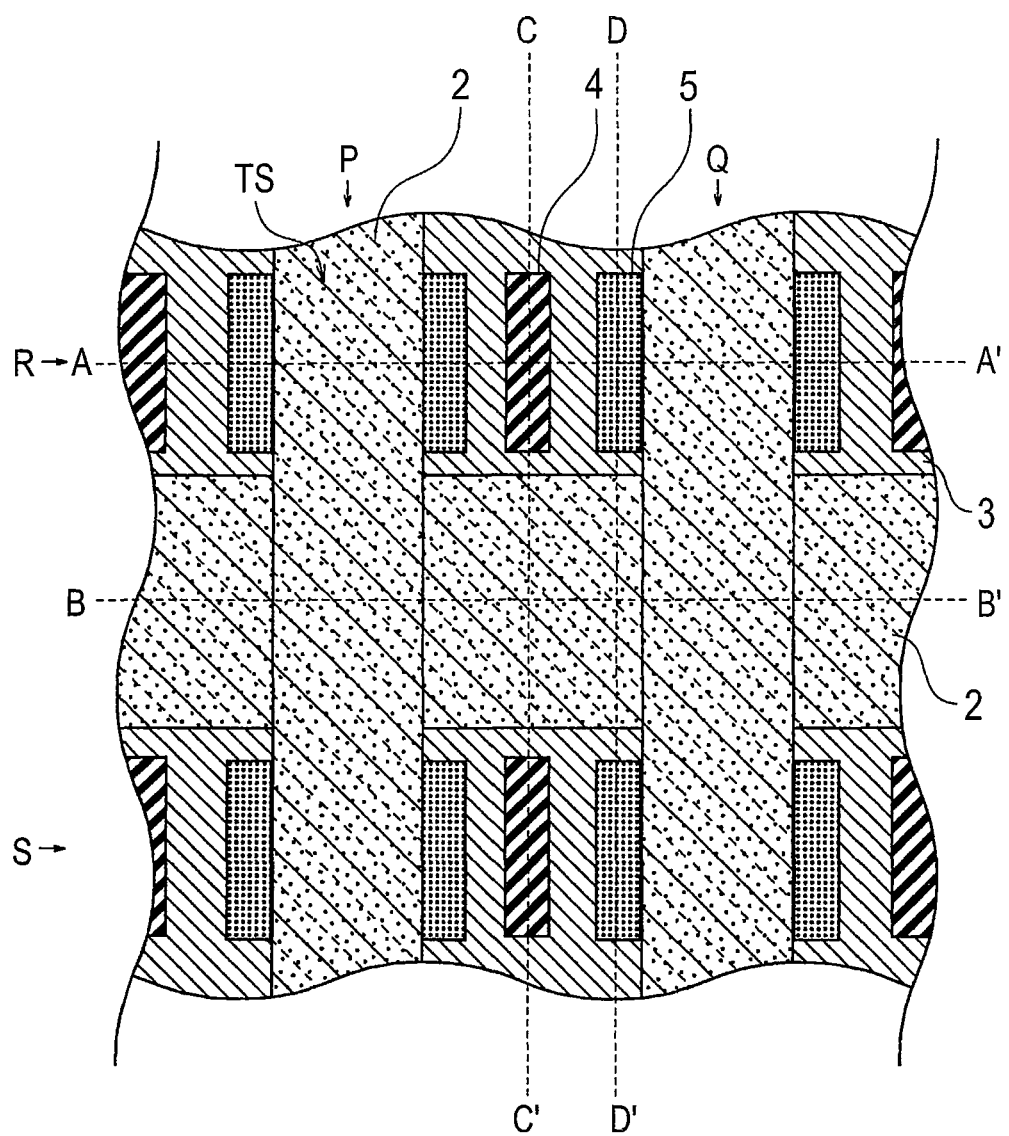
FIG. 9 is a plan view illustrating a fifth process of the method of manufacturing the semiconductor device according to the first embodiment of the present invention.
Figure 10A:
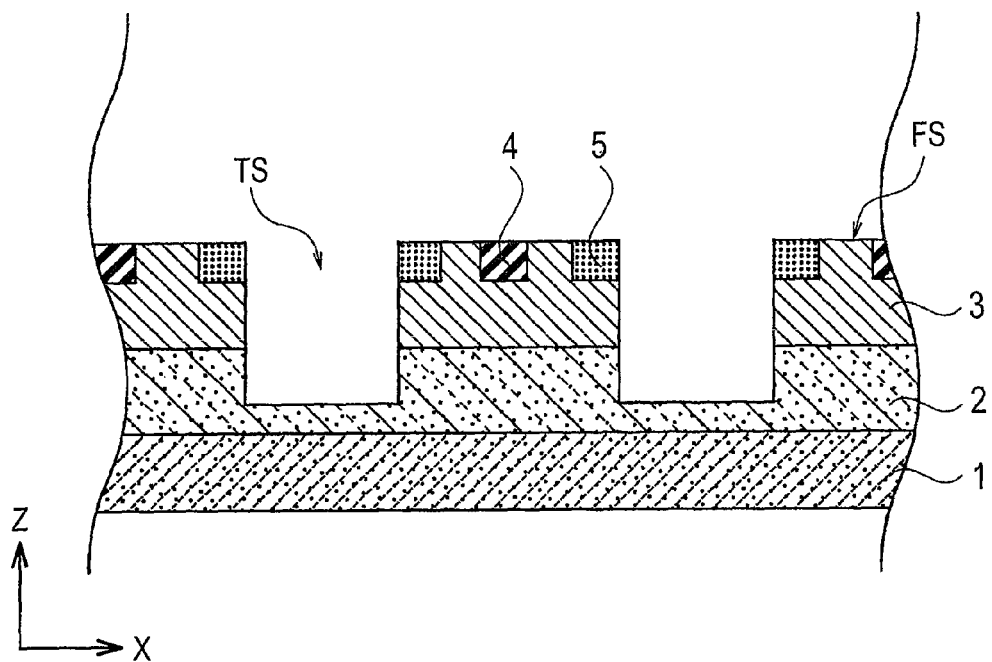
FIG. 10A is a cross-sectional view of A-A' cross section of FIG. 9.
Figure 10B:
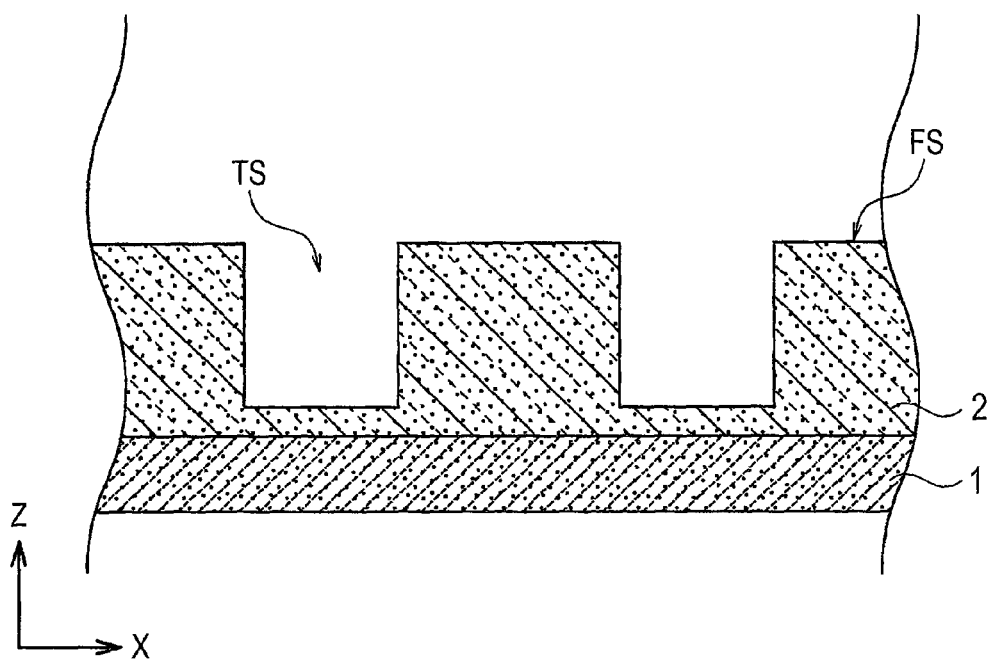
FIG. 10B is a cross-sectional view of B-B' cross section of FIG. 9.

(5) Next, as shown in FIGS. 9, 10A, and 10B, the drift region 2, first well regions 3, and source regions 5 are partially etched to form plural linear trenches TS parallel to the axis-Y direction (fifth process). Specifically, in a similar way to the aforementioned first process, an insulating film is formed as a mask material, and the insulating film is patterned to form an insulating film pattern. Dry etching such as RIE is performed using the insulating film pattern as a mask to form the trenches TS so that the bottoms of the trenches TS reach the drift region 2 and in the side surfaces thereof, the drift region 2, first well regions 3, and the source regions 5 are exposed. Making the trenches TS deeper than the first well regions 3 allows electric conduction between the source regions 5 and drift region 2 through the inversion layers formed at the side surfaces of the insulating gate portions.

Figure 11:
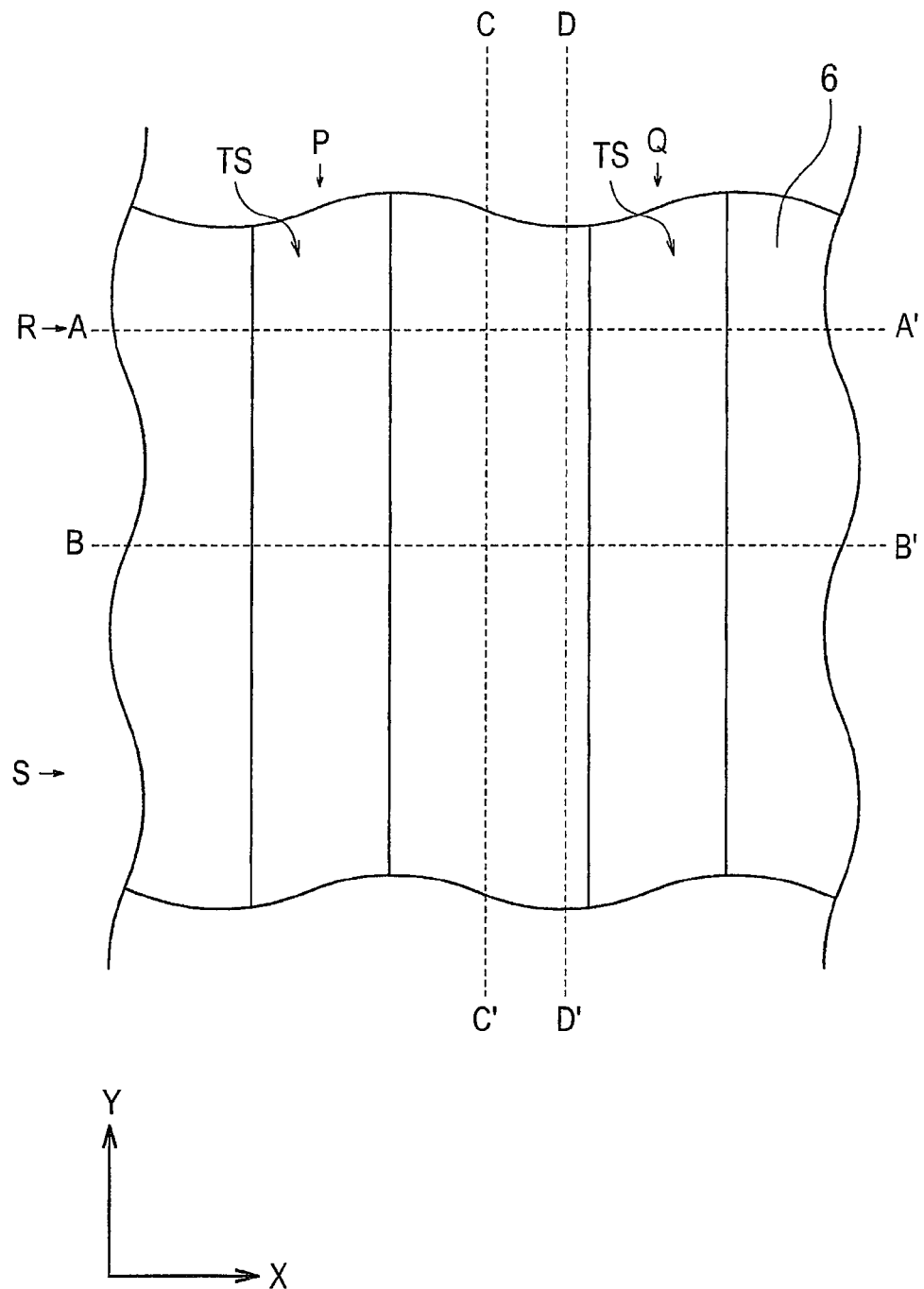
FIG. 11 is a plan view illustrating a sixth process of the method of manufacturing the semiconductor device according to the first embodiment of the present invention.
Figure 12A:
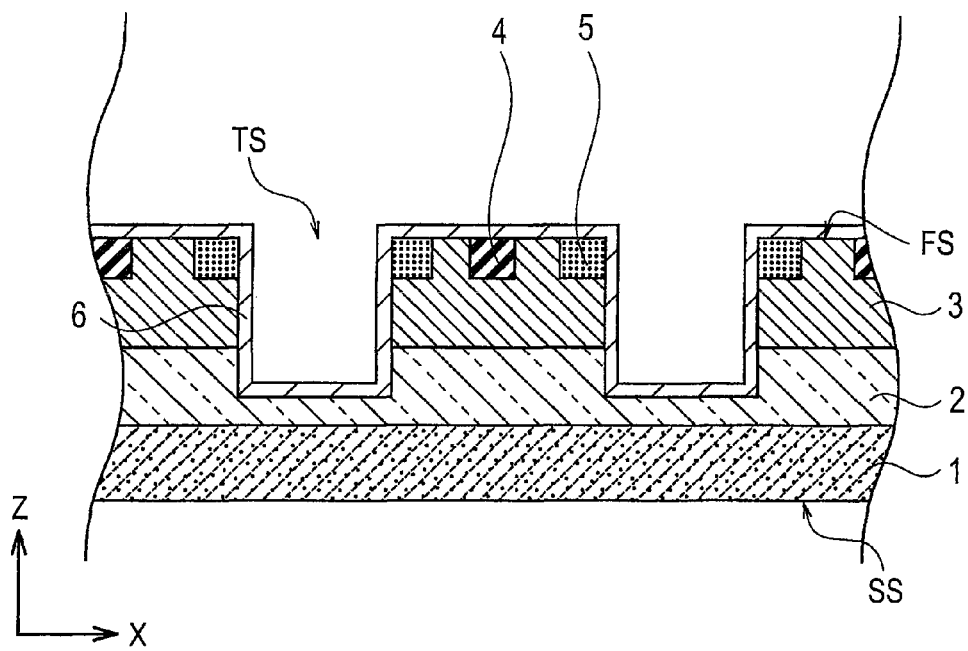
FIG. 12A is a cross-sectional view of A-A' cross section of FIG. 11.
Figure 12B:
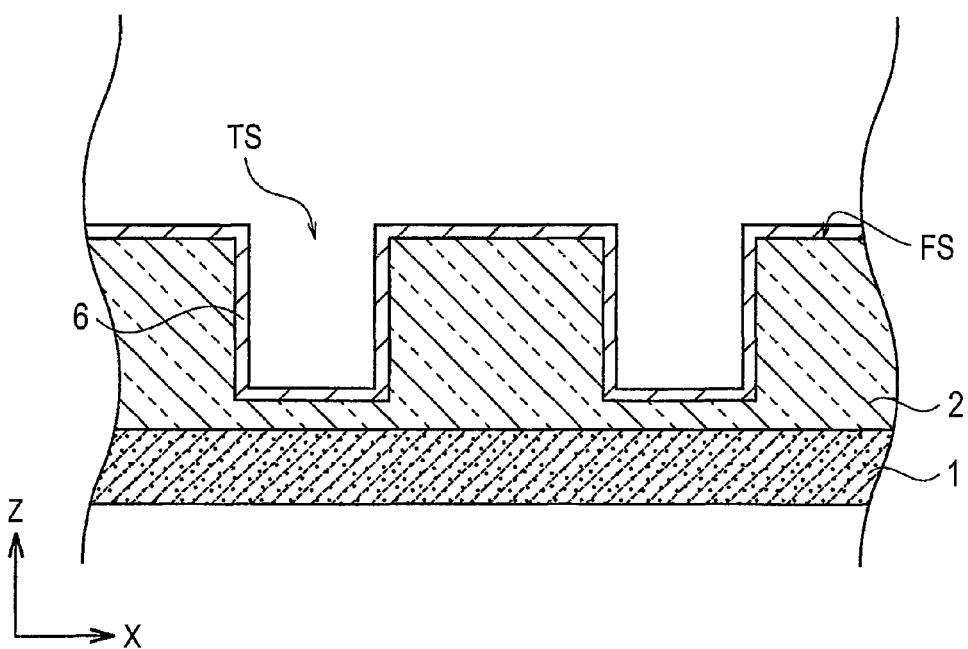
FIG. 12B is a cross-sectional view of B-B' cross section of FIG. 11.

(6) Next, as shown in FIGS. 11, 12A, and 12B, the gate insulating films 6 are deposited on the inner walls of the trenches TS and the major surface FS (sixth process). The gate insulating film 6 is preferably a silicon oxide film and is deposited by thermal oxidation, thermal CVD, plasma CVD, sputtering, or the like. The thickness of the gate insulating films 6 is about 10 to 100 nm, for example. After the deposition of the gate insulating films 6, annealing may be performed at about 1000° C. in an atmosphere of nitrogen, argon, $N_2O$, or the like in order to prevent generation of interface state at the interfaces between the drift region 2 and the gate insulating films 6.

Figure 13:
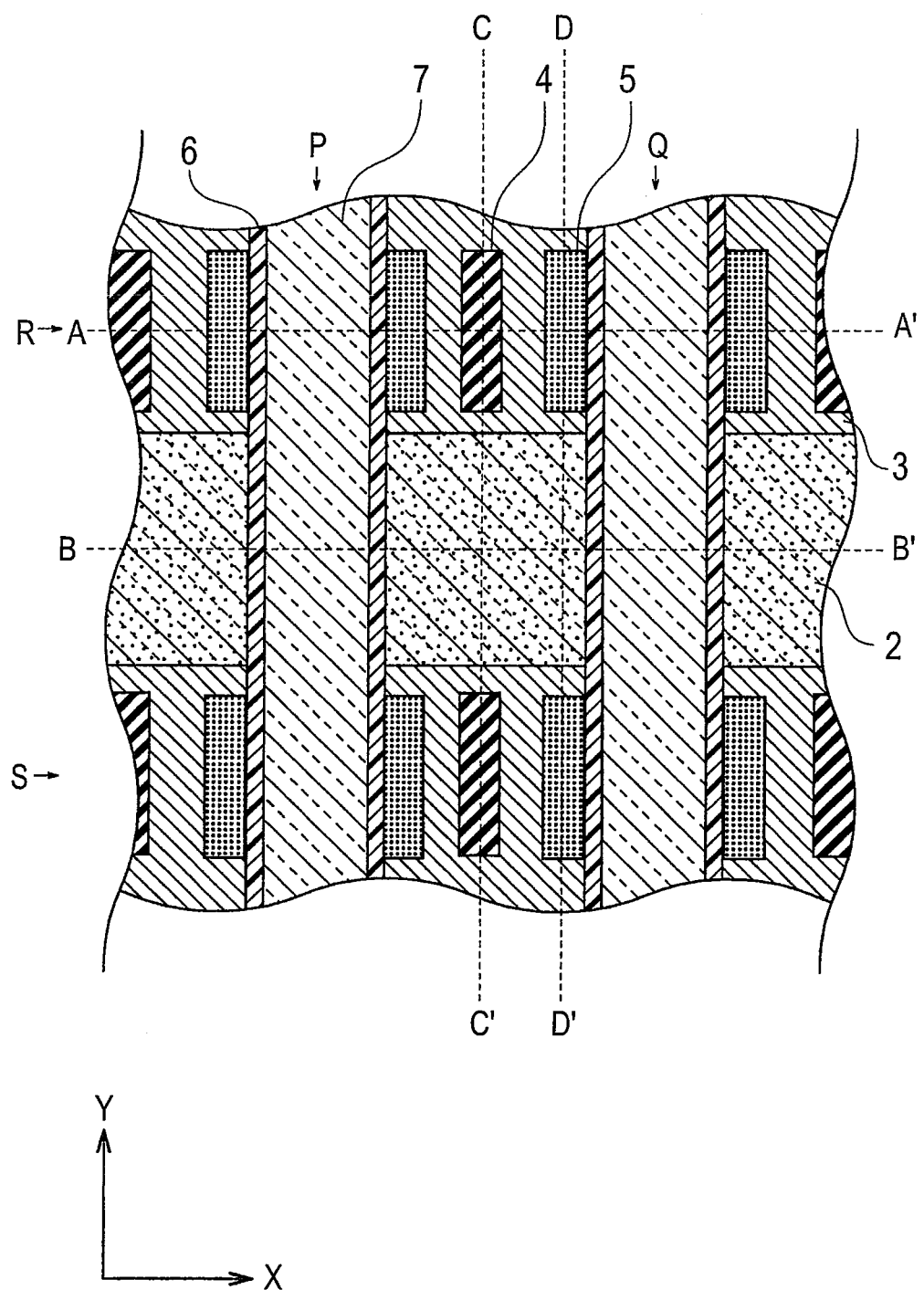
FIG. 13 is a plan view illustrating a seventh process of the method of manufacturing the semiconductor device according to the first embodiment of the present invention.
Figure 14A:
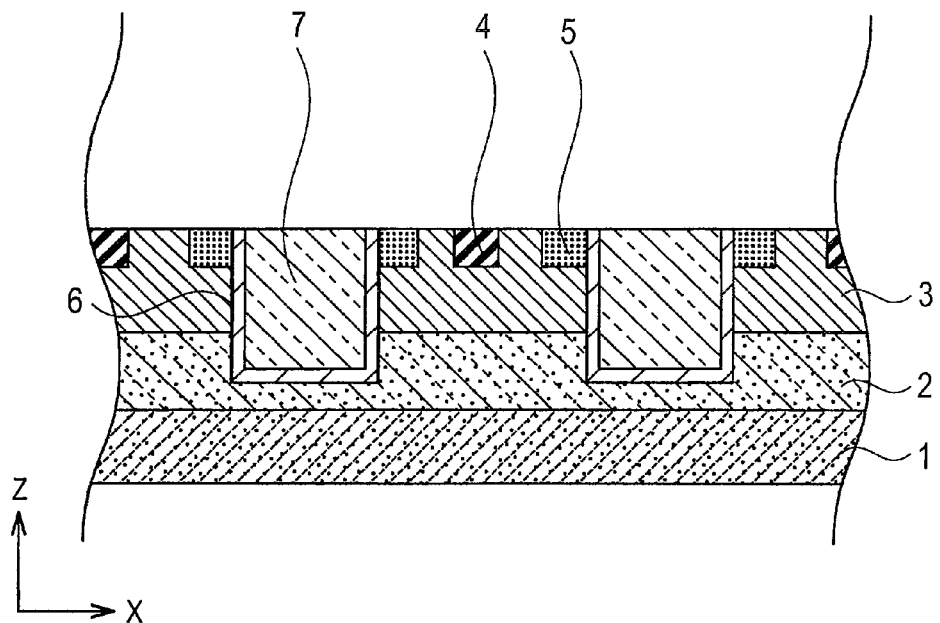
FIG. 14A is a cross-sectional view of A-A' cross section of FIG. 13.
Figure 14B:
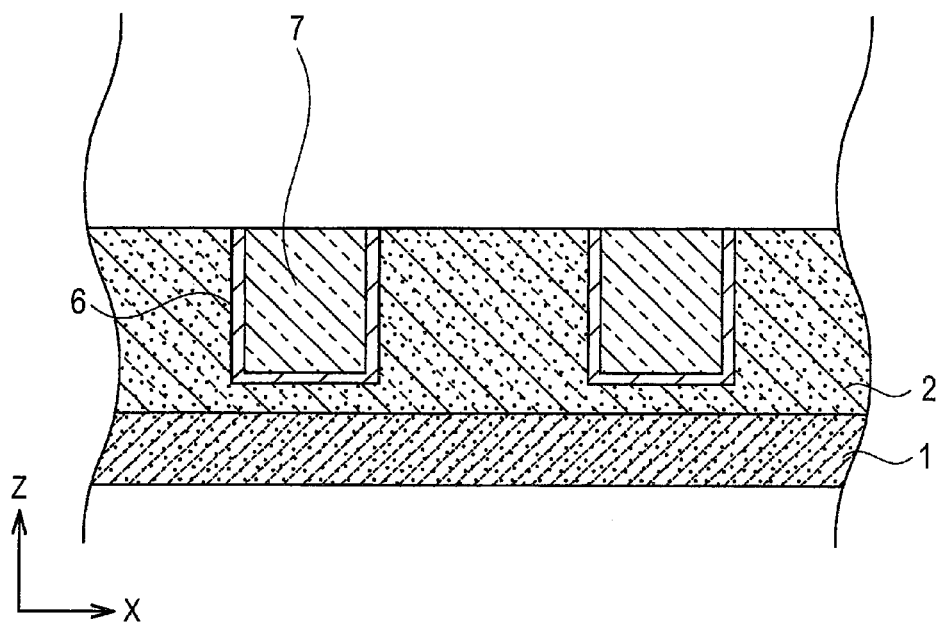
FIG. 14B is a cross-sectional view of B-B' cross section of FIG. 13.

(7) Next, as shown in FIGS. 13, 14A, and 14B, the gate electrodes 7 are embedded in the respective trenches TS (Seventh process). The gate electrodes 7 are preferably made of polycrystalline silicon added with impurities. Specifically, first, using general low-pressure CVD, polycrystalline silicon film is deposited in the trenches TS and on the major surface FS. Next, the polycrystalline silicon is etched back from the major surface FS side. This etch back process stops when the polycrystalline silicon film deposited on the major surface FS is removed and the gate insulating films 6 deposited on the major surface FS is exposed. Alternatively, a resist pattern may be formed on the polycrystalline silicon film, and the polycrystalline silicon film is patterned using dry etching, for example. The part of the polycrystalline silicon film other than the part embedded in the trenches is then removed. Part of the polycrystalline silicon film embedded inside the gate insulating films 6 can be left as the gate electrodes 7.

Thereafter, part of the gate insulating films 6 exposed on the major surface FS is removed. Specifically, an insulating film pattern is formed on the gate electrodes 7 embedded in the trenches TS, and wet etching or dry etching such as RIE is performed using the insulating film pattern as a mask to remove part of the gate insulating films 6 exposed in the major surface FS.

Figure 15:
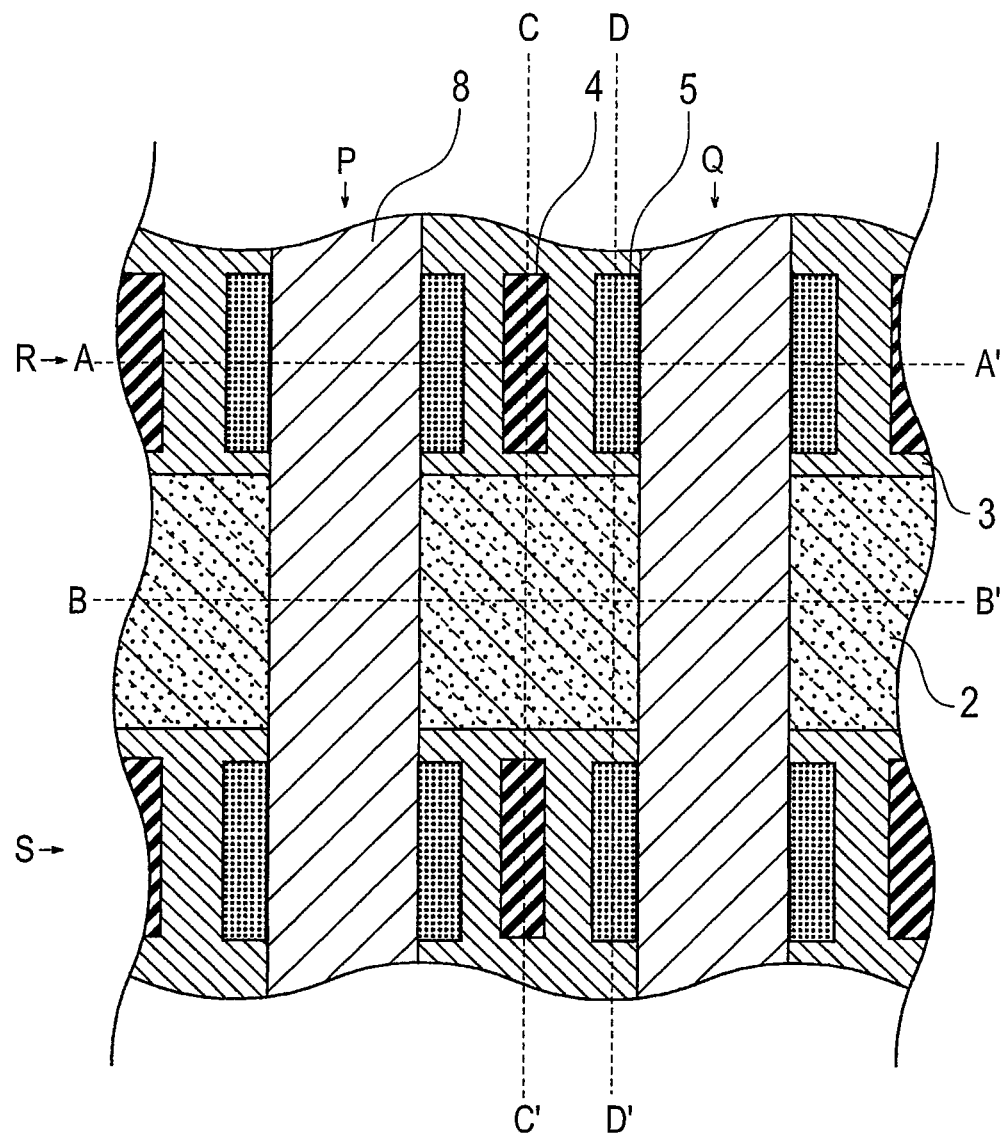
FIG. 15 is a plan view illustrating an eighth process of the method of manufacturing the semiconductor device according to the first embodiment of the present invention.
Figure 16A:
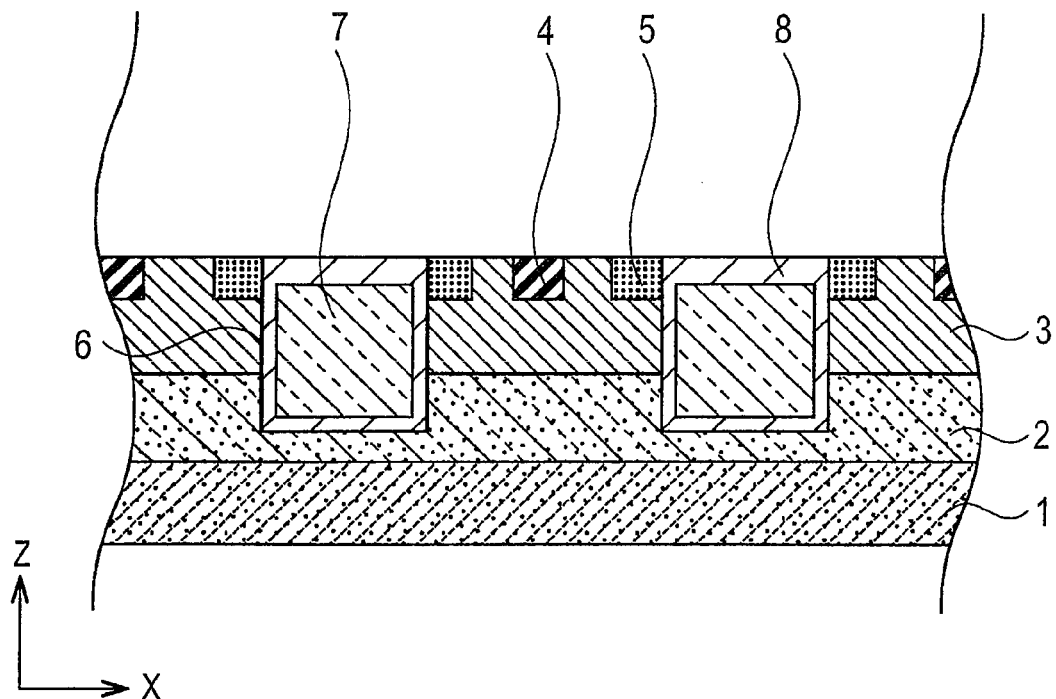
FIG. 16A is a cross-sectional view of A-A' cross section of FIG. 15.
Figure 16B:
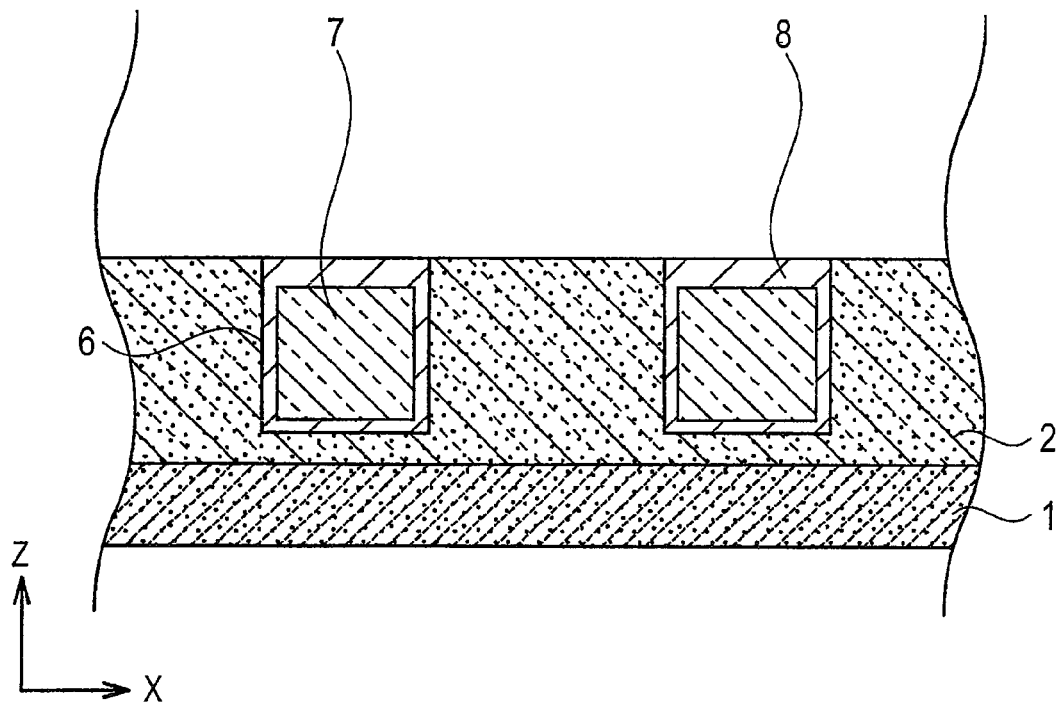
FIG. 16B is a cross-sectional view of B-B' cross section of FIG. 15.

(8) Next, as shown in FIGS. 15, 16A, and 16B, the interlayer insulting films 8 are formed on the gate electrodes 7 (eighth process). The interlayer insulating films 8 are preferably composed of silicon oxide film. The interlayer insulating films 8 may be formed by thermally oxidizing the gate electrodes 7 or by depositing an insulating film using thermal CVD, plasma CVD, sputtering, or the like. On the deposited insulating film, a resist pattern is formed, and the resist pattern is used as a mask to form contact holes in the interlayer insulating films 8. The contact holes are openings where regions other than the gate electrodes 7 are exposed.

Figure 17:
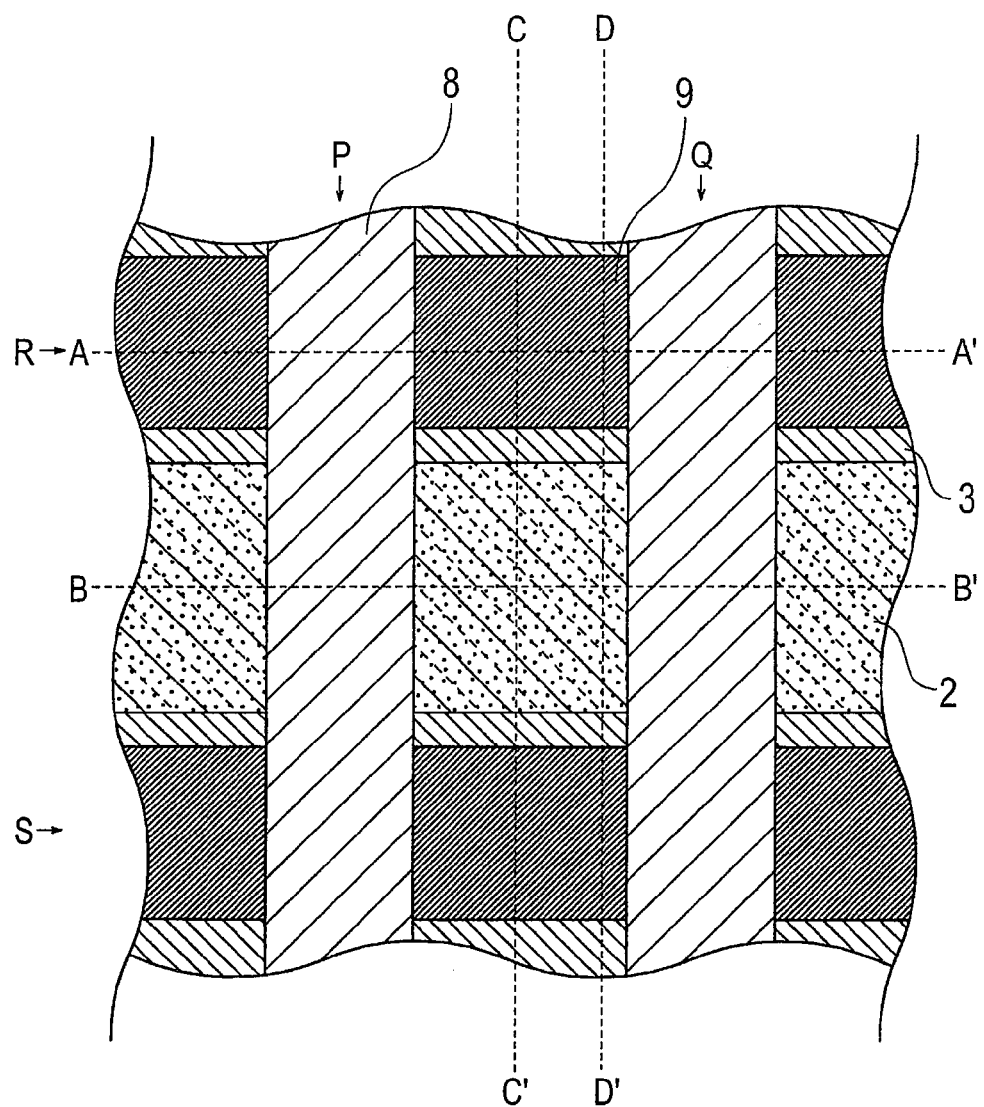
FIG. 17 is a plan view illustrating a ninth process of the method of manufacturing the semiconductor device according to the first embodiment of the present invention.
Figure 18A:
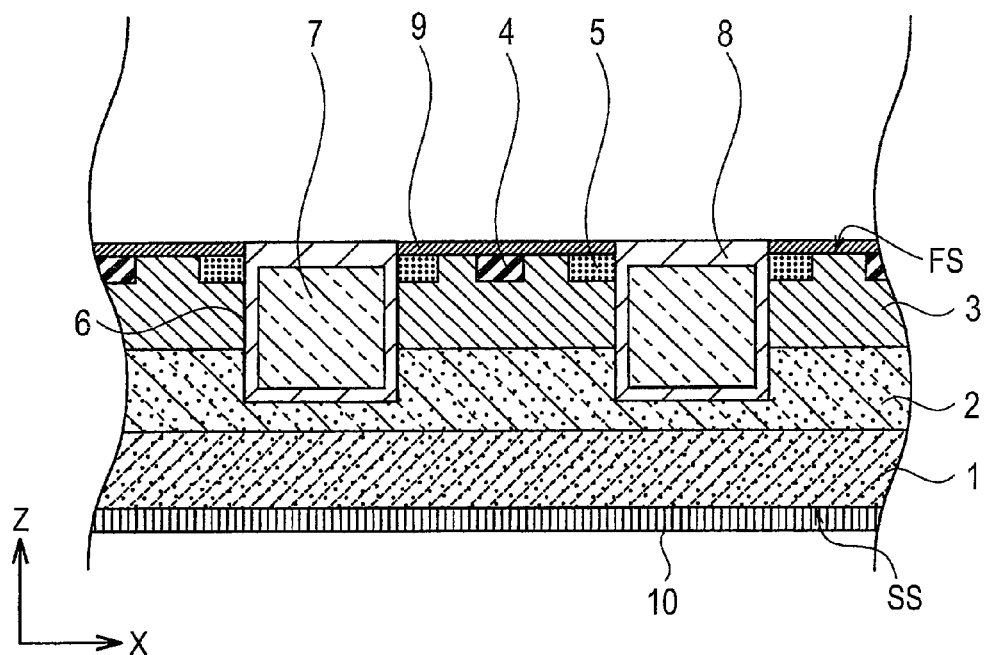
FIG. 18A is a cross-sectional view of A-A' cross section of FIG. 17.
Figure 18B:
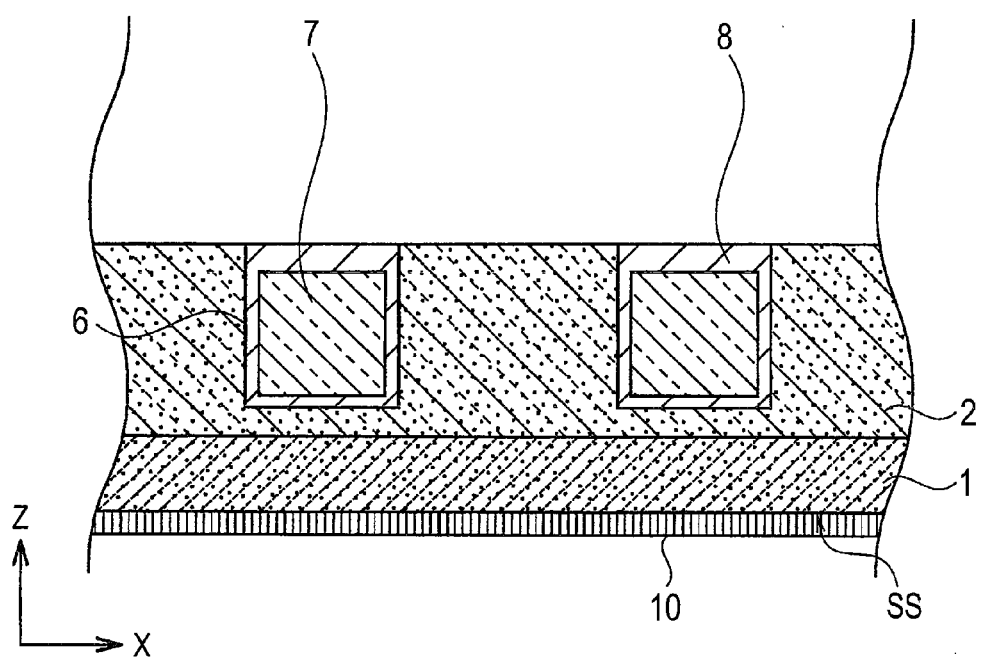
FIG. 18B is a cross-sectional view of B-B' cross section of FIG. 17.

(9) Next, as shown in FIGS. 17, 18A, and 18B, the ohmic electrodes 9, which are in ohmic contact with the well contact regions 4 and source regions 5, are formed, and the second main electrode 10, which is in ohmic contact with the major surface SS of the semiconductor substrate 1, is formed (Ninth process). The ohmic electrodes 9 and the second main electrode 10 may be formed in any order. The ohmic electrodes 9 are preferably made of nickel silicide but may be made of metal such as cobalt silicide or titanium silicide.

Specifically, first, nickel film is deposited in regions within the first well regions 3 and is patterned. The deposition can be performed by vapor deposition, sputtering, CVD, or the like. The patterning is preferably performed by a lift-off process but may be performed by dry or wet etching. Next, in a similar manner, nickel film is deposited on a rear surface (major surface SS) of the semiconductor substrate 1. Next, by annealing at about 1000° C., silicon carbide and nickel are alloyed to form nickel silicide, thus forming the ohmic electrodes 9 and second main electrode 10. The ohmic electrodes 9 are connected to the well contact regions 4 and source regions 5 with low electric resistance, and the second main electrode 10 is connected to the semiconductor substrate 1 with low electric resistance.

Figure 19:
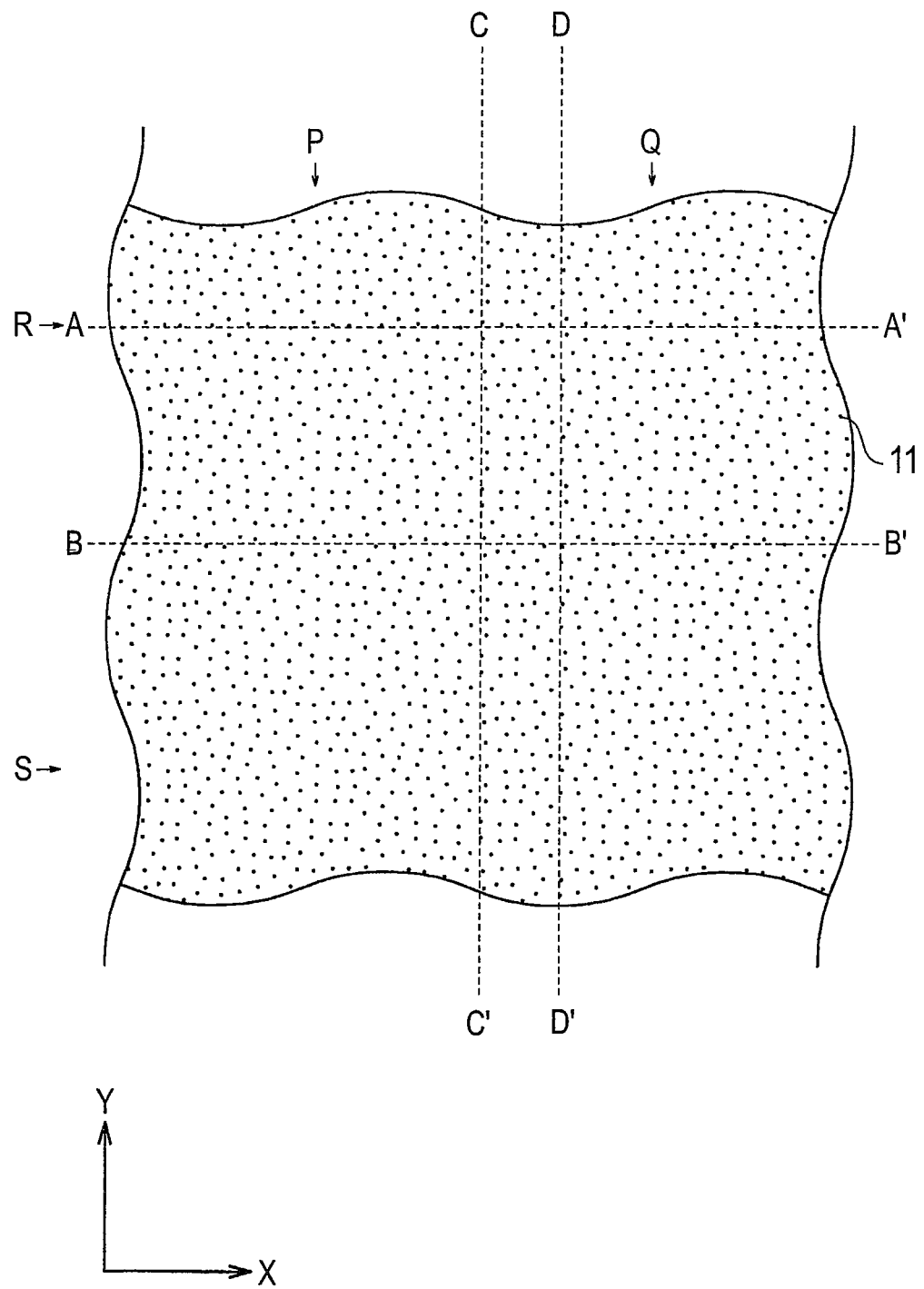
FIG. 19 is a plan view illustrating a tenth process of the method of manufacturing the semiconductor device according to the first embodiment of the present invention.
Figure 20A:
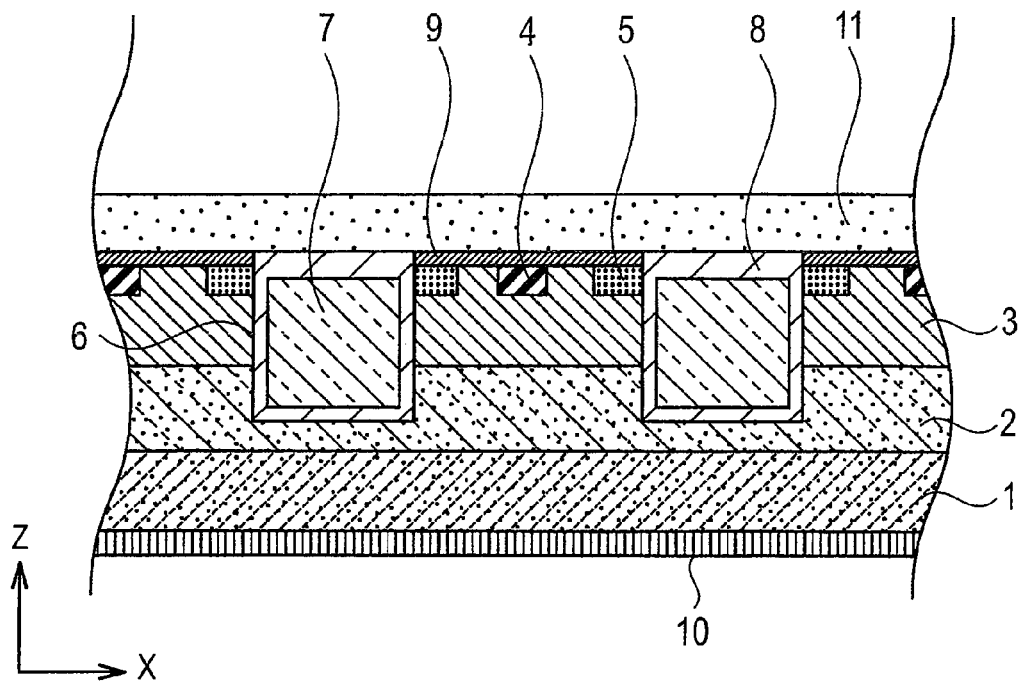
FIG. 20A is a cross-sectional view of A-A' cross section of FIG. 19.
Figure 20B:
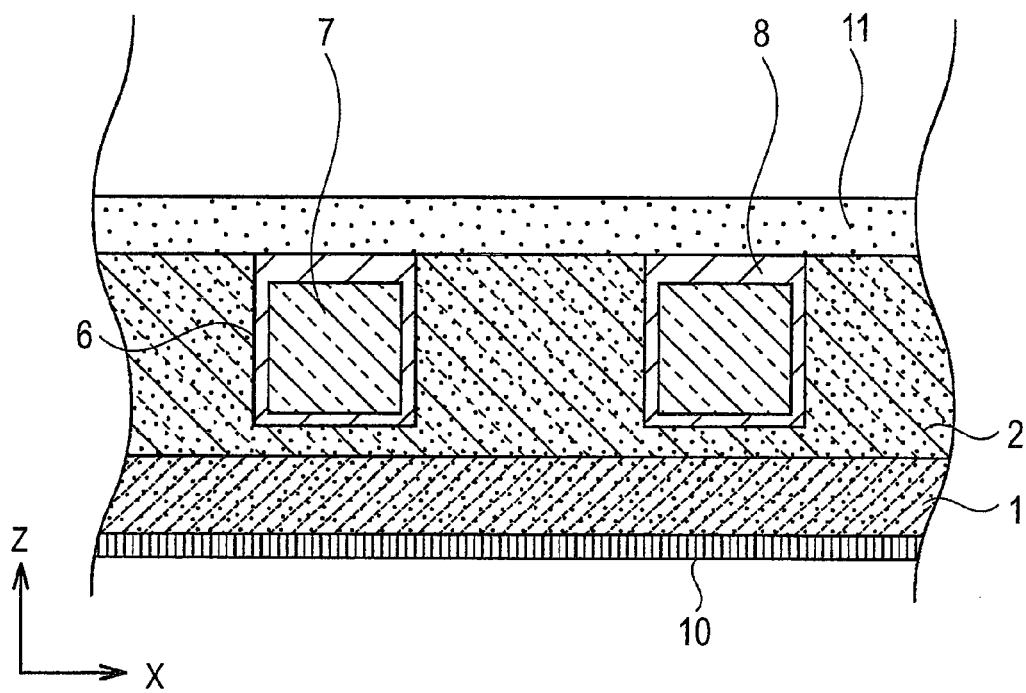
FIG. 20B is a cross-sectional view of B-B' cross section of FIG. 19.

(10) Next, as shown in FIGS. 19, 20A, and 20B, the Schottky electrode 11 is deposited and patterned. Part of the Schottky electrode 11 at the outer periphery of the semiconductor device is removed (Tenth process). The patterning can be performed by dry or wet etching or a lift-off process using a resist pattern as a mask. The resist can be patterned using photolithography.

(11) Next, the source electrode 12 is deposited on the Schottky electrode 11 and is patterned using a similar manner to the method for the Schottky electrode 11 (eleventh process). The Schottky electrode 11 and source electrode 12 are separately patterned herein but may be sequentially deposited and simultaneously patterned. Through the aforementioned processes, the semiconductor device shown in FIGS. 1 and 2A to 2D is thus completed.

As described above, according to the first embodiment of the present invention, the following operational effects can be obtained.

Between the adjacent insulating gate portions (6 to 8), the Schottky junction portions 13, where the first main electrode (9, 11, and 12) forms Schottky junctions with the drift region 2, and first well regions 3 are arrayed in the direction that the insulating gate portions (6 to 8) extend. It is therefore possible to reduce the distance between each pair of adjacent insulating gate portions (6 to 8). The semiconductor device can be therefore miniaturized.

In conventional semiconductor devices, only two insulating gate portions (6 to 8) are set per predetermined area. However, according to the embodiment of the present invention, three or more insulating gate portions (6 to 8) can be set. This can increase the current density per predetermined area and therefore reduce the on-resistance of the semiconductor device.

The distances between the adjacent first well regions 3 along the direction that the insulating gate portions (6 to 8) extend is set in accordance with the following condition: in a state where the MOSFET is off, when a predetermined voltage is applied across the drift region 2 and first main electrode (9, 11, and 12) in a direction opposite to the forward direction of the SBD, the depletion layers extending from the edges of the adjacent first well regions 3 into the drift region 2 overlap each other. This can further reduce the electric field at the Schottky barrier interfaces.

As shown in FIG. 2D, the inversion layers (channels) are formed not only in the axis-Z direction but also in the axis-Y direction, and current flows through such inversion layers. It is therefore possible to provide a MOSFET with a low electric resistance between the second main electrode 10 and source electrode 12 when the MOSFET is on, that is, to provide a MOSFET with low on-resistance.

In a general SBD, leak current exponentially increases as the voltage increases, and therefore leak current is more likely to occur than at p-n junctions. However, the SBD formed between the Schottky electrode 11 and drift region 2, which is shown in FIGS. 2C and 2D, has a JBS structure. That is to say, the depletion layers extend from the first well regions 3 of p-type, which is connected to the Schottky electrode 11, in the direction Y, so that the electric field at the Schottky barrier interfaces can be reduced. Accordingly, compared with a general SBD, it is possible to reduce leak current of the semiconductor device in the state where the MOSFET is off. As the leak current is reduced, the Schottky barrier height of the SBD can be set lower. The semiconductor device can incorporate a SBD having a lower on-resistance.

Accordingly, by providing the SBD having a lower on-voltage than the body diode incorporated in the MOSFET, the on-voltage of the semiconductor device at reflux state can be lowered, and the steady loss can be reduced. Moreover, the SBD, which is an example of the unipolar diode, has a characteristic of having less reverse recovery charges than those of a bipolar diode such as a PN diode. This can further reduce the switching loss caused at switching from the state where current is flowing through the SBD to the state where the current is shut off.

In the fifth process shown in FIGS. 9, 10A, and 10B, the first well regions 3 and trenches TS for forming the JBS structure have linear patterns orthogonal to each other. This eliminates the need for precise alignment of the first well regions 3 with the trenches TS. It is therefore possible to provide a high-yield semiconductor device without reduction in yield due to misalignment.

Second Embodiment

Figure 21A:
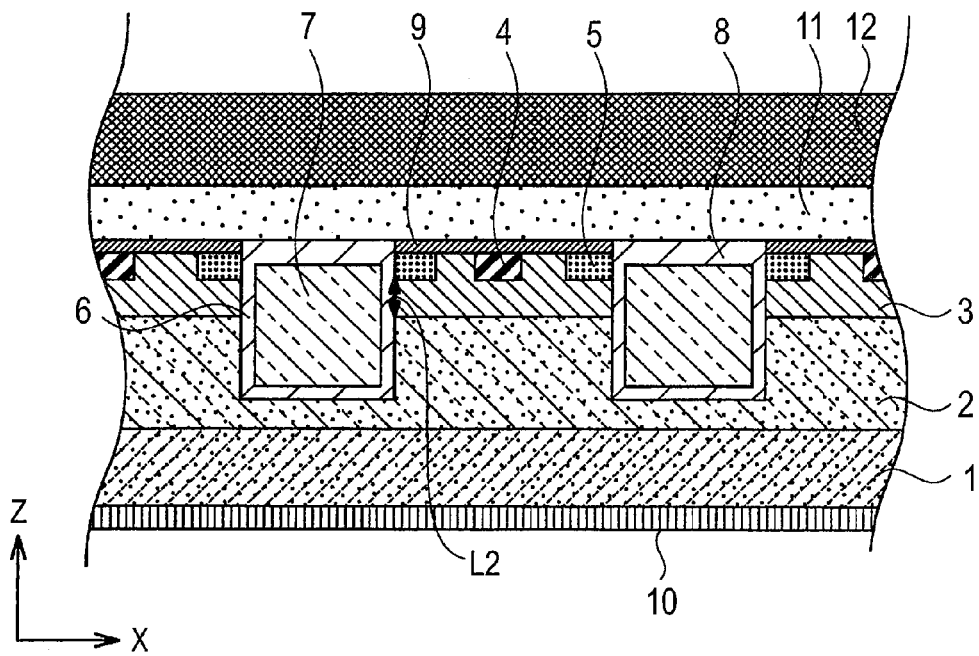
FIG. 21A is a cross-sectional view of A-A' cross section of a semiconductor device according to a second embodiment of the present invention.
Figure 21B:
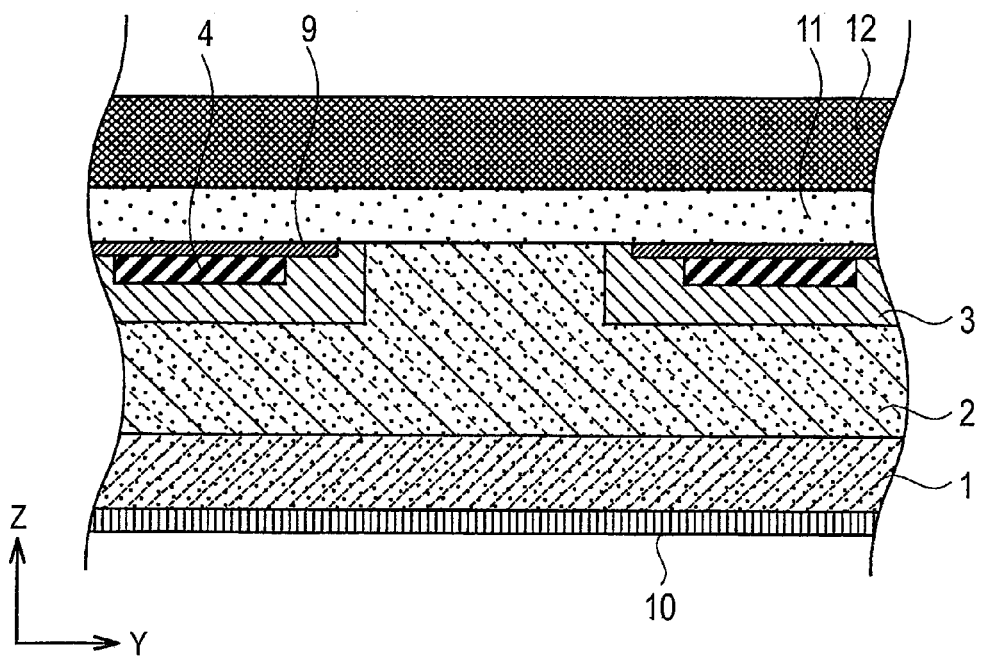
FIG. 21B is a cross-sectional view of C-C' cross section of the semiconductor device shown in FIG. 21A.
Figure 21C:
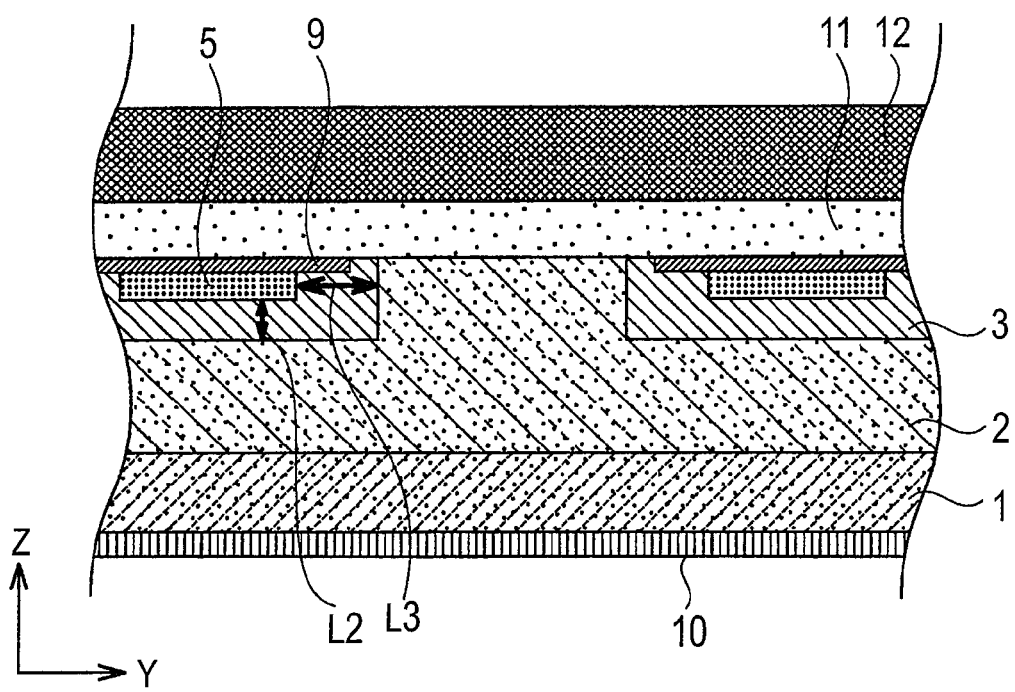
FIG. 21C is a cross-sectional view of D-D' cross section of the semiconductor device shown in FIG. 21A.

With reference to FIGS. 21A to 21C, a description is given of a configuration of a semiconductor device according to a second embodiment of the present invention. FIGS. 21A to 21C show the cross-sectional configurations of A-A' cross section, C-C' cross section, and D-D' cross section of the semiconductor device according to the second embodiment of the present invention. The plan view thereof is the same as FIG. 1 and is not shown. The cross sectional configuration of the semiconductor device of the B-B' cross section is the same as that of FIG. 2B and is not shown.

As shown in FIGS. 21A and 21C, distance L3 between the source region and drift region in the vertical direction to the normal of the major surface FS is longer than distance L2 between the source region 5 and drift region 2 in the parallel direction to the normal of the major surface FS. The distance L3 corresponds to the channel length of the MOSFET in the axis-Y direction, and the distance L2 corresponds to the channel length of the MOSFET in the axis-Z direction. Accordingly, the channel length in the axis-Y direction is longer than the channel length in the axis-Z direction. The threshold voltage for channel formation in the direction parallel to the normal of the major surface FS of the drift region 2 can be therefore set higher than the threshold voltage for channel formation in the direction vertical to the normal of the major surface FS of the drift region 2. This can prevent on-current flowing through the channel from being concentrated on the narrow region (L3 part), thus providing a semiconductor device with high breakdown resistance, reliability, and yield.

For example, in the second process to form the first well regions 3, voltage to accelerate p type impurity ions should be lowered. The p type impurities are therefore implanted from the major surface FS into a shallow region, and the first well regions 3 are made shallow. The distance L2 between the source region 5 and drift region 2 in the parallel direction to the normal of the major surface FS can be made short.

The other configuration, operations, and manufacturing method are the same as those of the first embodiment, and the description thereof is omitted.

Third Embodiment

FIG. 22A shows an arrangement of the first well regions 3, insulating gate portions (6, 7, and 8), Schottky junction portions 13, well contact regions 4, and source regions 5 when viewed in the normal direction of the major surface FS. The first main electrode (9, 11, and 12) is not shown in the drawing.

In FIG. 22A, the part between P and Q corresponds to a unit cell in the axis-X direction, and the part between R and S corresponds to a unit cell in the axis-Y direction. In the part other than the range shown in FIG. 22A, the unit cells are repeated in the axis-X direction and axis-Y direction.

The plural well contact regions 4 have linear patterns which intersect with the insulating gate portions (6 to 8) and are parallel to each other. The plural source regions 5 have linear patterns which intersect with the insulating gate portions (6 to 8) and are parallel to each other. The structure of the first well regions 3, well contact regions 4, and source regions 5 is uniform in the axis-X direction. Accordingly, the distance between each pair of adjacent insulating gate portions (6 to 8) can be further reduced.

Moreover, it is unnecessary to precisely align the insulating gate portions (6 to 8) with not only the first well regions 3 but also the well contact regions 4 and source regions 5. Accordingly, the reduction in yield due to misalignment can be further prevented.

Figure 22B:
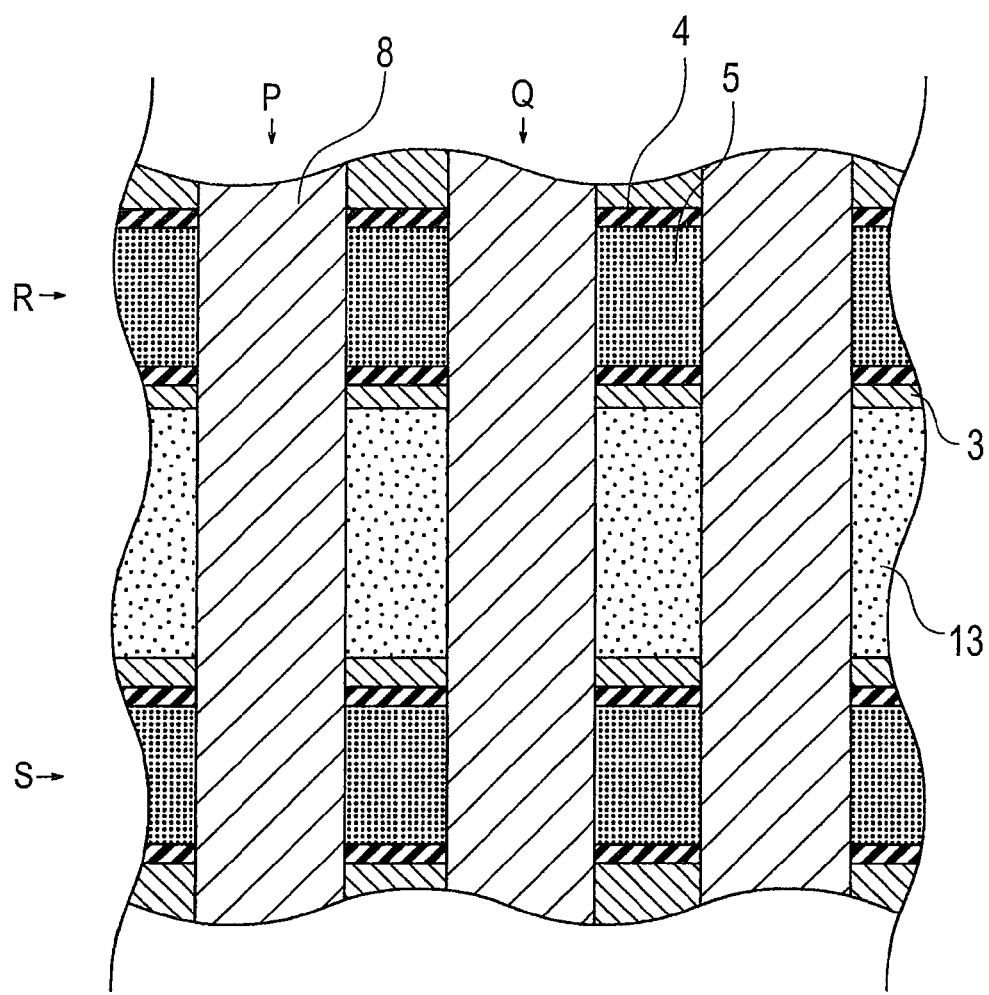
FIG. 22B is a plan view illustrating a configuration of a semiconductor device according to a first modification of the third embodiment of the present invention.

Furthermore, the p+ type well contact regions 4 are formed in the channel portions parallel to the axis-Y direction, which is shown in FIG. 22B. Accordingly, the threshold voltage is high at the channel portions parallel to the axis-Y direction. This can prevent the on-current flowing through the channels from being concentrated on the narrow regions (L3 portion). It is therefore possible to provide a semiconductor device with high breakdown resistance, reliability, and yield.

The other configuration, operations, and manufacturing method are the same as those of the first embodiment, and the description thereof is omitted.

First Modification

FIG. 22B shows a first modification obtained by reducing the distances between the insulating gate portions (6 to 8) shown in FIG. 22A. In FIG. 22B, the part between P and Q corresponds to a unit cell in the axis-X direction, and the part between R and S corresponds to a unit cell in the axis-Y direction. In the part other than the range shown in FIG. 22A, the unit cells are repeated in the axis-X direction and axis-Y direction.

By densely providing the insulating gate portions (6 to 8), the width of the unit cells in the axis-X direction is reduced, and the unit cells can be reduced in size. It is therefore possible to provide a MOSFET with further low on-resistance.

Fourth Embodiment

Figure 24:
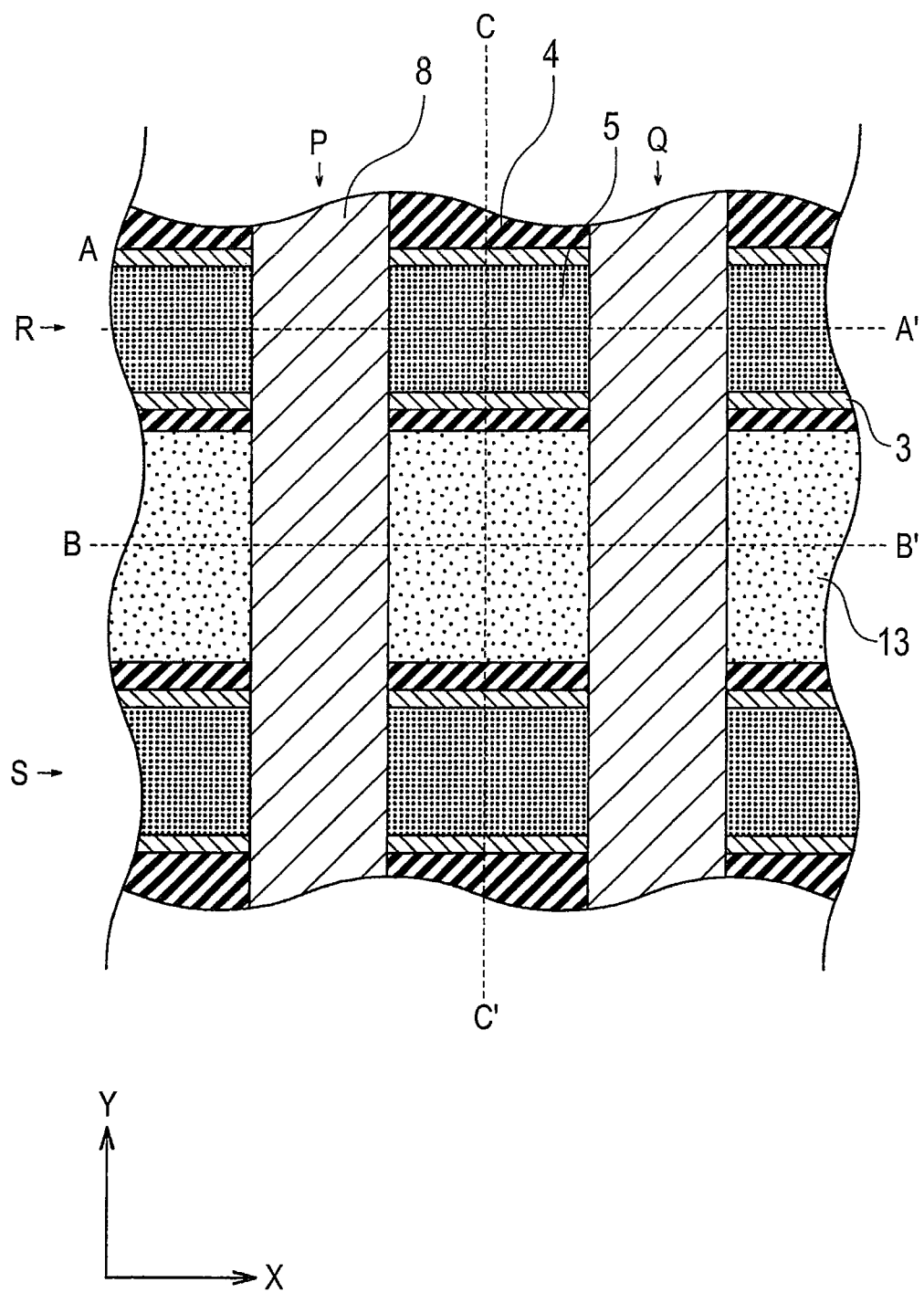
FIG. 24 is a plan view illustrating a configuration of a semiconductor device according to a fourth embodiment of the present invention.

FIG. 24 shows an arrangement of the first well regions 3, insulating gate portions (6, 7, and 8), Schottky junction portions 13, well contact regions 4, and source regions 5 when viewed in the normal direction of the major surface FS. The first main electrode (9, 11, and 12) is not shown in the drawing.

Figure 23A:
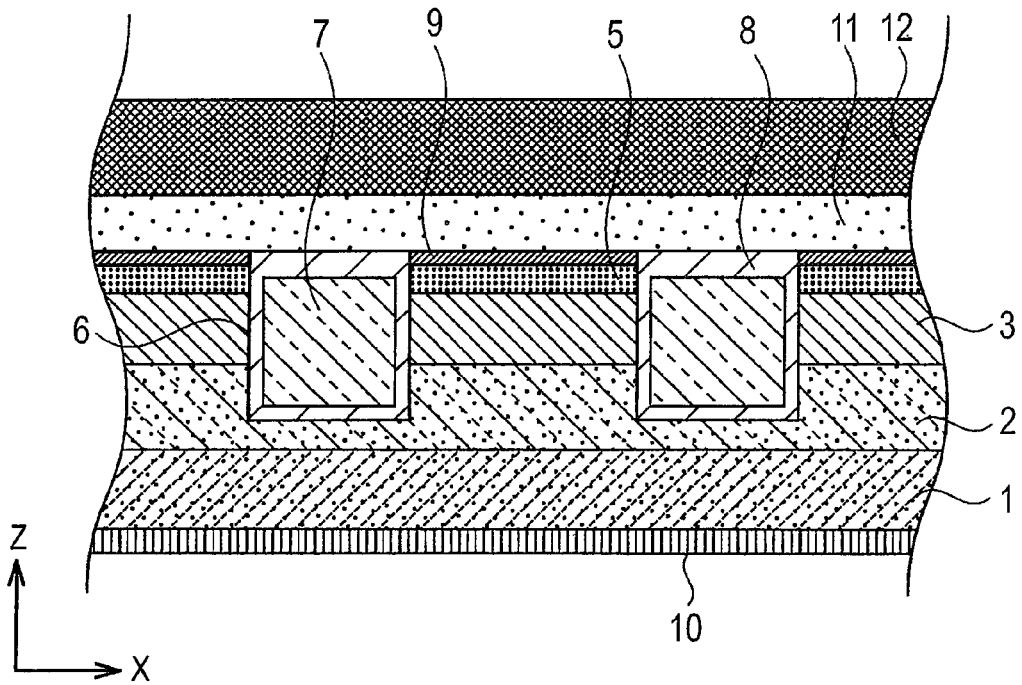
FIG. 23A is a cross-sectional view of A-A' cross section of the semiconductor device shown in FIG. 22A.
Figure 25:
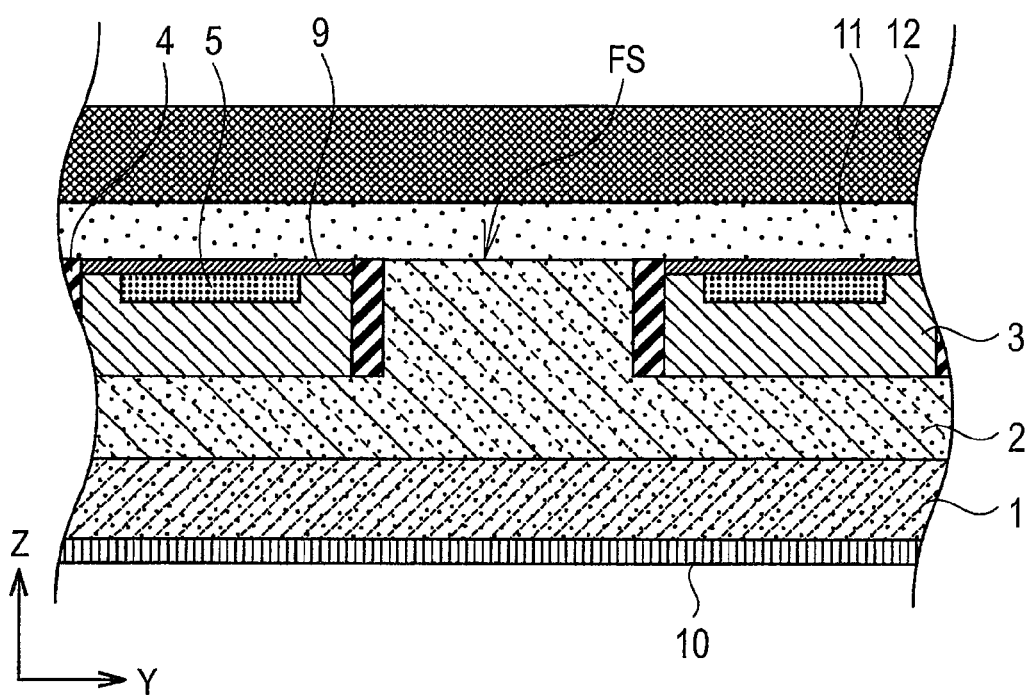
FIG. 25 is a cross-sectional view of C-C' cross section of the semiconductor device shown in FIG. 24.

FIG. 25 shows a cross-sectional configuration of C-C' cross section of the semiconductor device shown in FIG. 24. The cross-sectional configurations of the semiconductor device at A-A' cross-section and B-B' cross-section in FIG. 24 are the same as those of FIG. 23A and FIG. 2B, respectively, and the description thereof is omitted.

In FIG. 24, the part between P and Q corresponds to a unit cell in the axis-X direction, and the part between R and S corresponds to a unit cell in the axis-Y direction. In the part other than the range shown in FIG. 24, the unit cells are repeated in the axis-X direction and axis-Y direction.

The semiconductor device of the fourth embodiment differs from that of the third embodiment in that the p+ type well contact regions 4, which include p type impurities at a higher concentration than that of the first well regions 3, are located at the boundaries between the drift region 2 and the first well regions 3. To be specific, as shown in FIG. 25, the well contact regions 4 are located at boundary planes substantially vertical to the major surface FS among the boundary planes between the first well regions 3 and drift region 2.

With such a structure, as shown in FIG. 25, the JBS structure in which the two well contact regions 4 sandwich the drift region 2 can be formed, and the width of the depletion layers extending from the two well contact regions 4 into the drift region 2 can be increased. Accordingly, the effect on reducing the electric field at the Schottky barrier interface can be more pronounced, and the leak current flowing through the SBD when the MOSFET is off can be further reduced. As the leak current is reduced, the Schottky barrier height of the SBD can be set lower. The semiconductor device can incorporate a SBD with a lower on-resistance.

Moreover, the p+ type well contact regions 4 are formed in channel portions parallel to the axis-Y direction, which is shown in FIG. 25. Accordingly, the threshold voltage is high in the channel portions parallel to the axis-Y direction. This can prevent on-current flowing through the channels from being concentrated on the narrow regions, thus providing a semiconductor device with high breakdown resistance, reliability, and yield.

The plural well contact regions 4 have linear patterns which intersect with the insulating gate portions (6 to 8) and are parallel to each other. The plural source regions 5 have linear patterns which intersect with the insulating gate portions (6 to 8) and are parallel to each other. The structure of the first well regions 3, well contact regions 4, and source regions 5 is therefore uniform in the axis-X direction. Accordingly, the distance between each pair of adjacent insulating gate portions (6 to 8) can be further reduced.

Moreover, it is unnecessary to precisely align the insulating gate portions (6 to 8) with not only the first well regions 3 but also the well contact regions 4 and source regions 5. Accordingly, the reduction in yield due to misalignment can be further prevented.

The other configuration, operations, and manufacturing method are the same as those of the third embodiment, and the description thereof is omitted.

Fifth Embodiment

Figure 26:
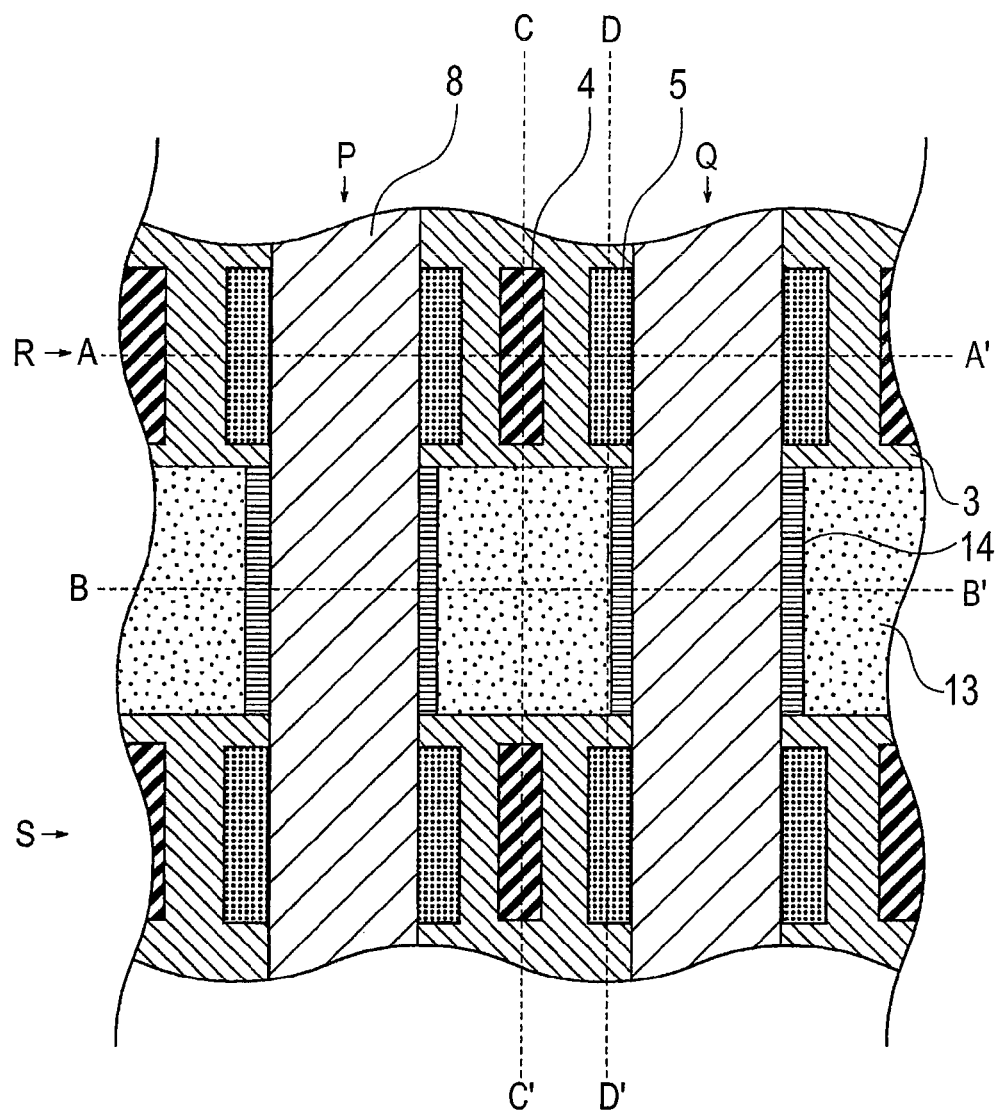
FIG. 26 is a plan view illustrating a configuration of a semiconductor device according to a fifth embodiment of the present invention.

FIG. 26 shows an arrangement of the first well regions 3, second well regions 14, the insulating gate portions (6, 7, and 8), the Schottky junction portions 13, the well contact regions 4, and the source regions 5 when viewed in the normal direction of the major surface FS. The first main electrode (9, 11, and 12) is not shown in the drawing.

Figure 27:
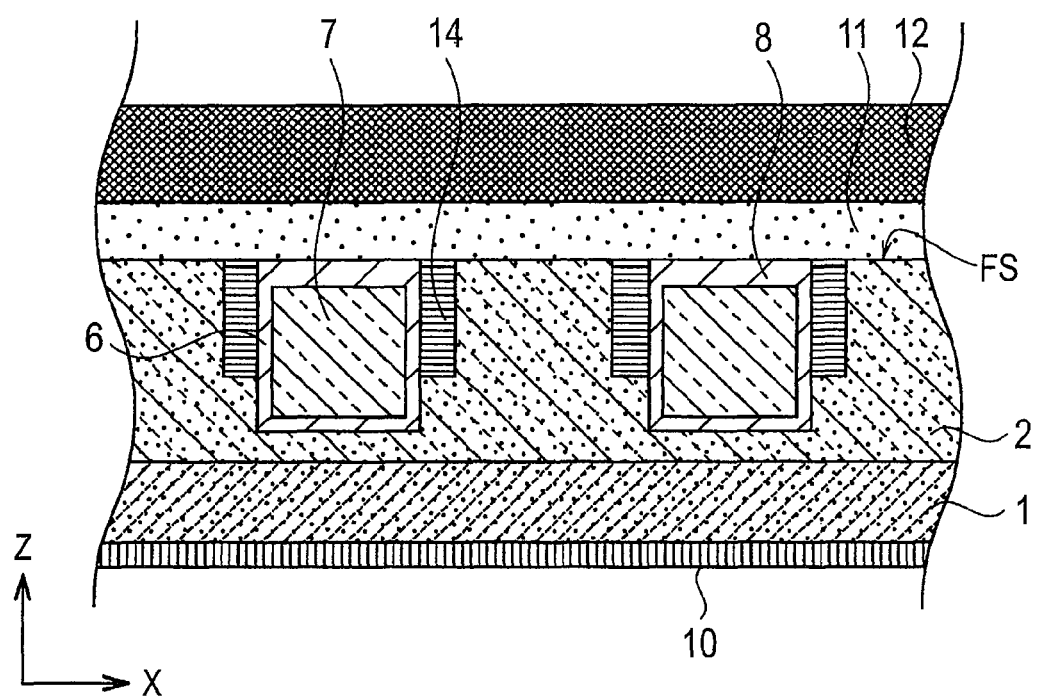
FIG. 27 is a cross-sectional view of B-B' cross section of the semiconductor device shown in FIG. 26.

FIG. 27 shows a cross-sectional configuration of B-B' cross section of the semiconductor device shown in FIG. 26. The cross-sectional configurations of the semiconductor device at A-A' cross-section, C-C' cross-section, and D-D' cross-section in FIG. 26 are the same as those of FIGS. 2A, 2C, and 2D, respectively, and are not shown.

The semiconductor device of the fifth embodiment differs from the semiconductor device of the first embodiment in further including the second well regions 14 of p− type which are located at the boundaries between the insulating gate portions (6 to 8) and the drift region 2 and are connected to the first main electrode (9, 11, and 12). Specifically, the second well regions 14 are provided on the boundary planes substantially vertical to the major surface FS among the boundary planes between the gate insulating films 6 and drift region 2. Furthermore, the second well regions 14 are partially exposed in the major surface of the drift region 2 and are in electric contact with the Schottky electrode 11 with low resistance. As shown in FIG. 26, therefore, each Schottky barrier junction 13 is surrounded by the first well regions 3 and second well regions 14.

With such a structure, as shown in FIG. 27, also in the cross section vertical to the direction that the insulating gate portions (6 to 8) extend, a JBS structure is formed. Compared to the first embodiment, the effect on reducing the electric field at the Schottky barrier interfaces can be made more pronounced, and the leak current flowing through the SBD when the MOSFET is off can be further reduced.

The kind and concentration of impurities added to the second well regions 14 may be the same as or different from those of the first well regions 3. The second well regions 14 may be formed simultaneously with the first well regions 3 or may be formed at a different process. The other configuration, operations, and manufacturing method are the same as those of the first embodiment, and the description thereof is omitted.

Sixth Embodiment

Figure 28:
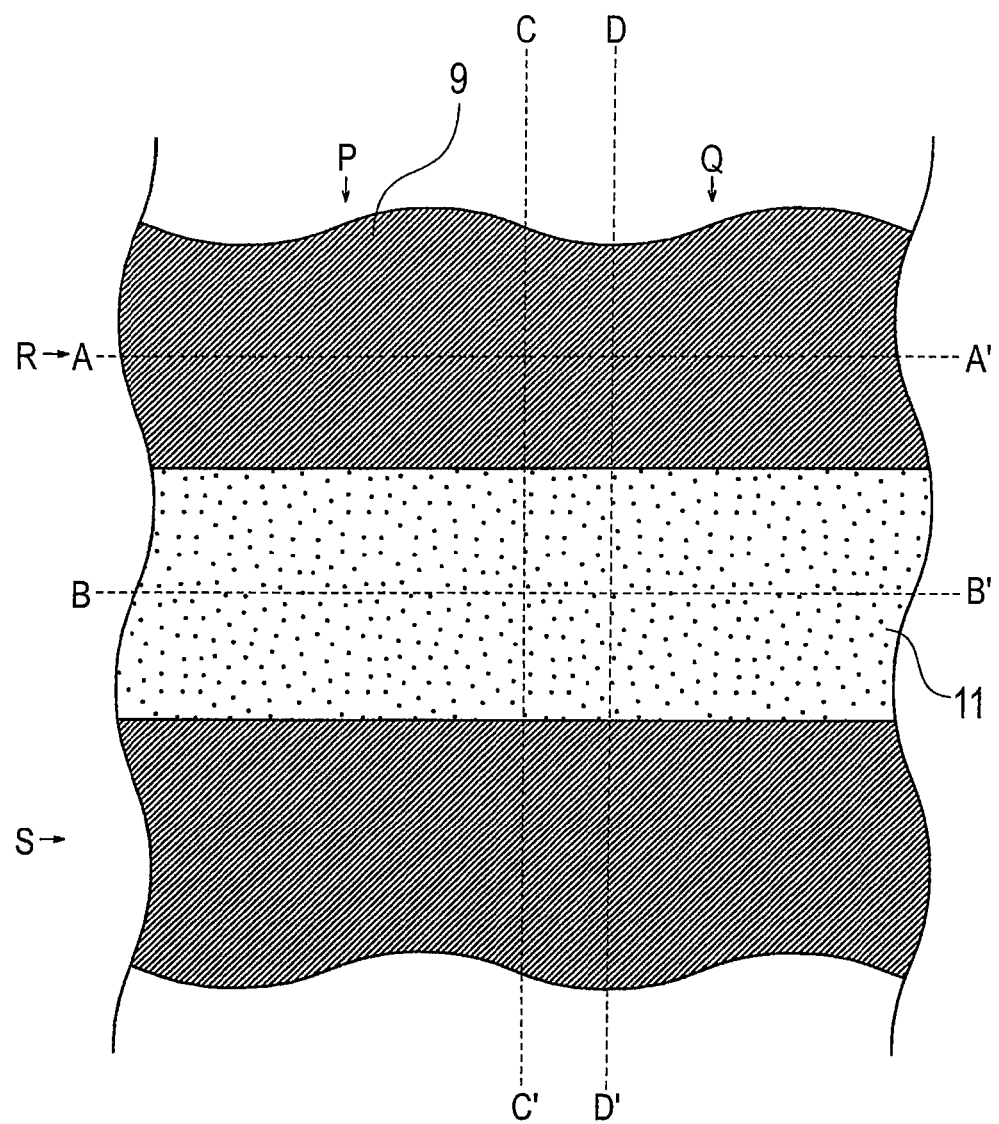
FIG. 28 is a plan view illustrating a configuration of a semiconductor device according to a sixth embodiment of the present invention.

FIG. 28 shows an arrangement of the ohmic electrodes 9 and Schottky electrode 11 when viewed in the normal direction of the major surface FS. The source electrode 12 is not shown in the drawing.

The part between P and Q in FIG. 28 corresponds to a unit cell in the axis-X direction, and the part between R and S corresponds to the unit cell in the axis-Y direction. In the other part than the range shown in FIG. 28, the unit cells are repeated in the axis-X direction and axis-Y direction.

Figure 29A:
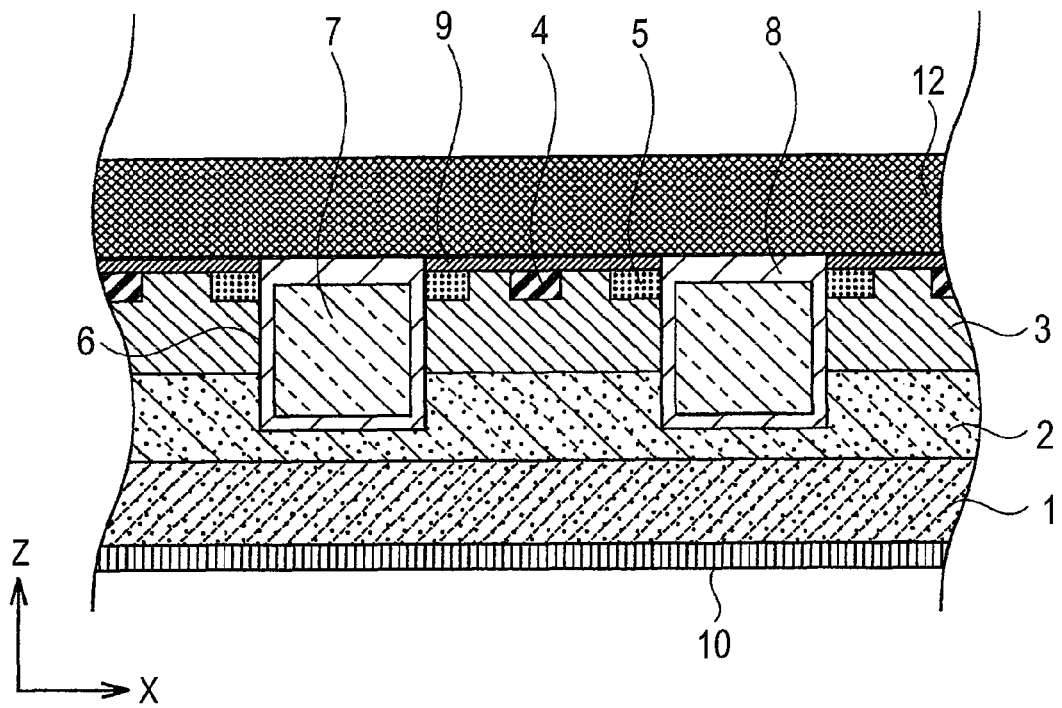
FIG. 29A is a cross-sectional view of A-A' cross section of the semiconductor device shown in FIG. 28.

FIG. 29A shows a cross-sectional configuration of A-A' cross section of the semiconductor device shown in FIG. 28.

Figure 29B:
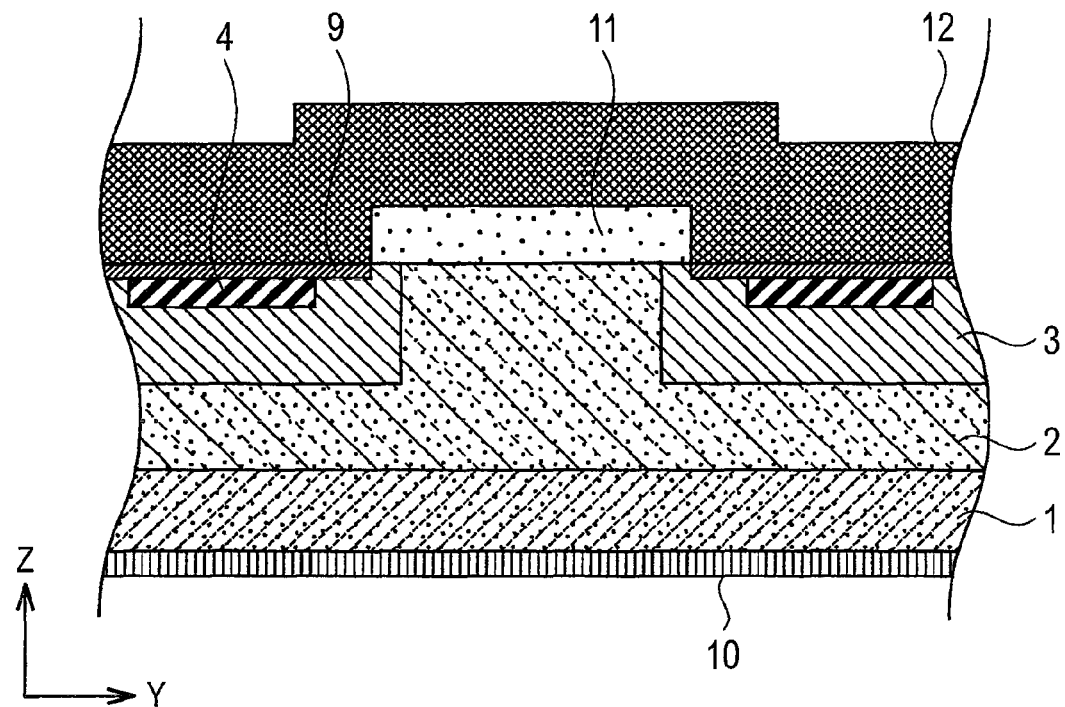
FIG. 29B is a cross-sectional view of C-C' cross section of the semiconductor device shown in FIG. 28.
Figure 29C:
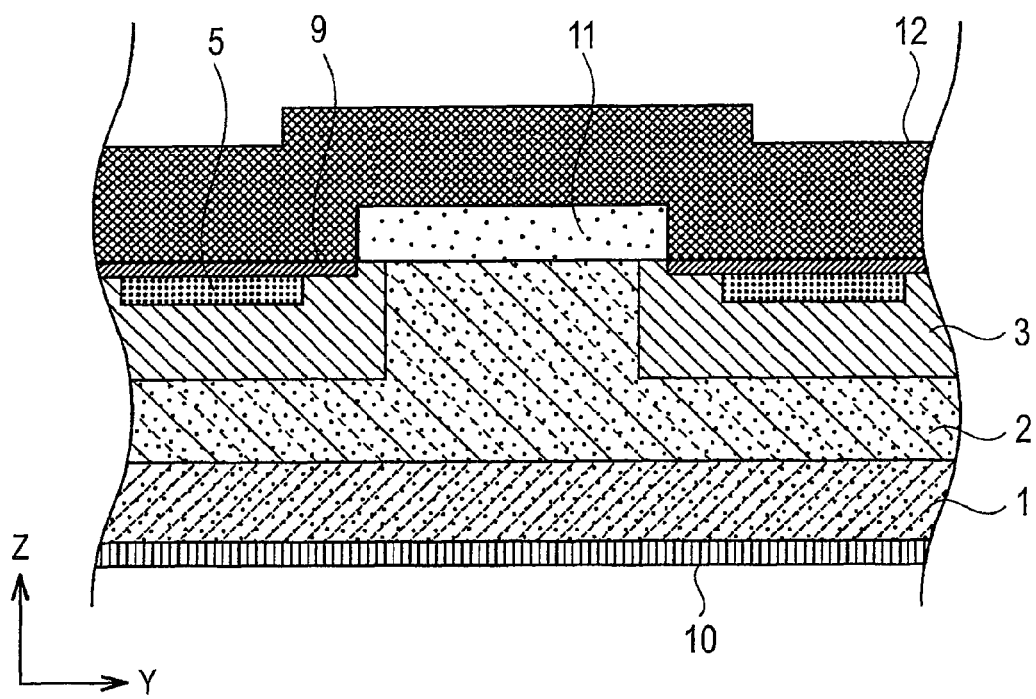
FIG. 29C is a cross-sectional view of D-D' cross section of the semiconductor device shown in FIG. 28.

FIG. 29B shows a cross-sectional configuration of C-C' cross section of the semiconductor device shown in FIG. 28. FIG. 29C shows a cross-sectional configuration of D-D' cross section of the semiconductor device shown in FIG. 28. The cross-sectional configuration of the semiconductor device of B-B' cross-section in FIG. 28 is the same as that of FIG. 2 and is not shown.

The semiconductor device according to the sixth embodiment differs from the semiconductor device according to the first embodiment in that the Schottky electrodes 11 are patterned. Specifically, as shown in FIG. 28, the Schottky electrodes 11 have linear patterns and are located so as to be orthogonal to the linear patterns of the insulating gate portions (6 to 8). The Schottky electrodes 11 and ohmic electrodes 9 are alternately arranged in the direction that the insulating gate portions (6 to 8) extend.

As shown in FIGS. 29B and 29C, the Schottky electrodes 11 are not located on the ohmic electrodes 9. On the ohmic electrodes 9, the source electrode 12 is directly placed. The both ends of each Schottky electrode 11 overlap the respective first well regions 3.

With such a configuration, the source electrode 12 and ohmic electrodes 9 are in direct contact with each other, thus reducing parasitic resistance between the source electrode 12 and source regions 5.

The other configuration, operations, and manufacturing method are the same as those of the first embodiment, and the description thereof is omitted.

Seventh Embodiment

In a seventh embodiment, a description is given of a case where the semiconductor device according to the third embodiment is given a change similar to the change given to the first embodiment in the sixth embodiment.

Figure 30A:
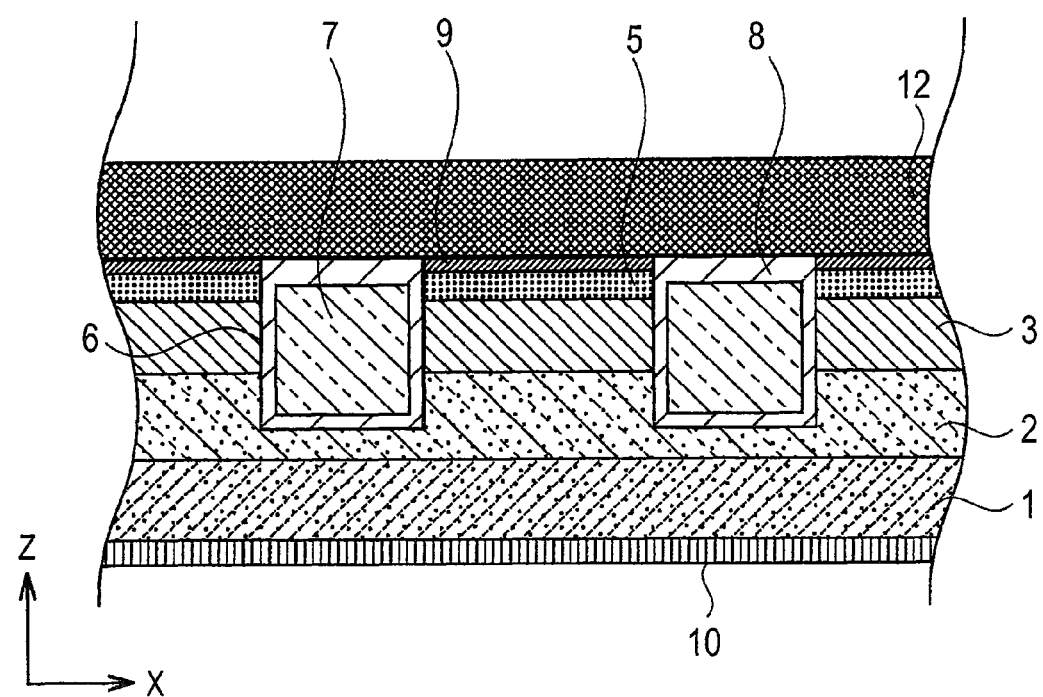
FIG. 30A is a cross-sectional view of A-A' cross section of a semiconductor device according to a seventh embodiment of the present invention.
Figure 30B:
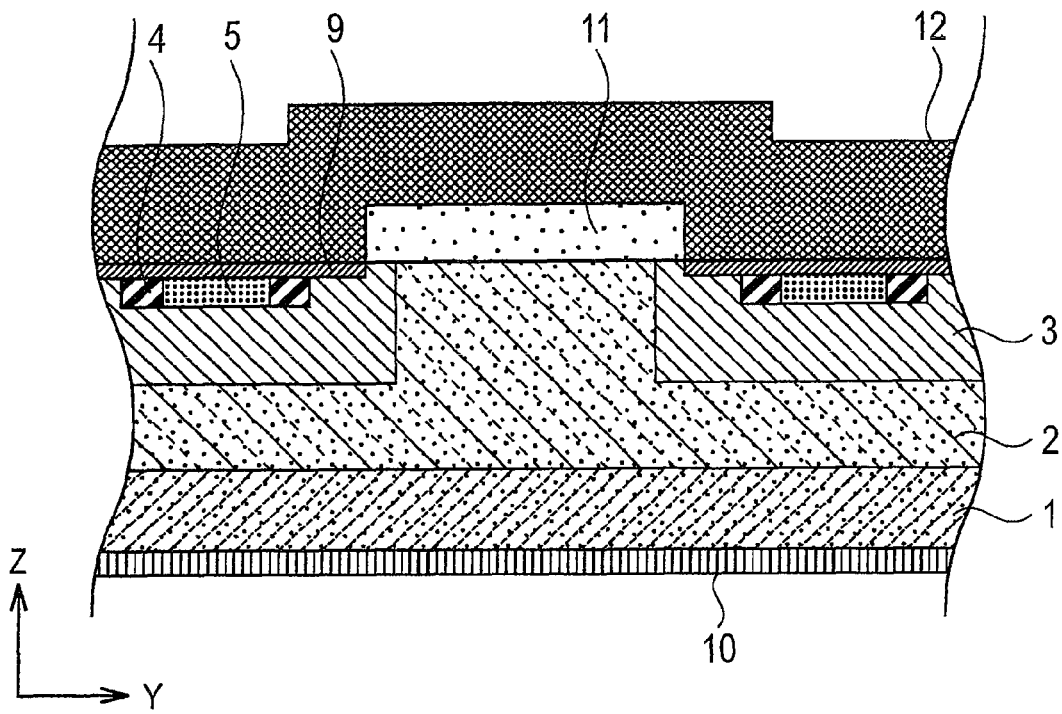
FIG. 30B is a cross-sectional view of C-C' cross section of the semiconductor device shown in FIG. 30A.

FIG. 30A shows a cross-sectional configuration of A-A' cross section of the semiconductor device according to the seventh embodiment of the present invention. FIG. 30B shows a cross-sectional configuration of C-C' cross section of the semiconductor device shown in FIG. 30A. The planer configuration of the semiconductor device and the cross-sectional configuration of the semiconductor device of B-B' cross-section thereof are the same as those of FIGS. 28 and 28B, respectively, and are not shown.

The semiconductor device according to the seventh embodiment differs from the semiconductor device according to the third embodiment in that the Schottky electrodes 11 are patterned. Specifically, as shown in FIG. 28, the Schottky electrodes 11 have linear patterns parallel to each other and are located so as to be orthogonal to the linear patterns of the insulating gate portions (6 to 8). The Schottky electrodes 11 and ohmic electrodes 9 are alternately arranged in the direction that the insulating gate portions (6 to 8) extend.

As shown in FIGS. 30A and 30B, the Schottky electrodes 11 are not located on the ohmic electrodes 9. On the ohmic electrodes 9, the source electrode 12 is directly placed. The both ends of each Schottky electrode 11 overlap the respective first well regions 3.

With such a configuration, the source electrode 12 and ohmic electrodes 9 are in direct contact with each other, thus reducing parasitic resistance between the source electrode 12 and source regions 5.

The other configuration, operations, and manufacturing method are the same as those of the third embodiment, and the description thereof is omitted.

Eighth Embodiment

In an eighth embodiment, a description is given of a case where the semiconductor device according to the fourth embodiment is given a change similar to the change given to the first embodiment in the sixth embodiment.

Figure 31:
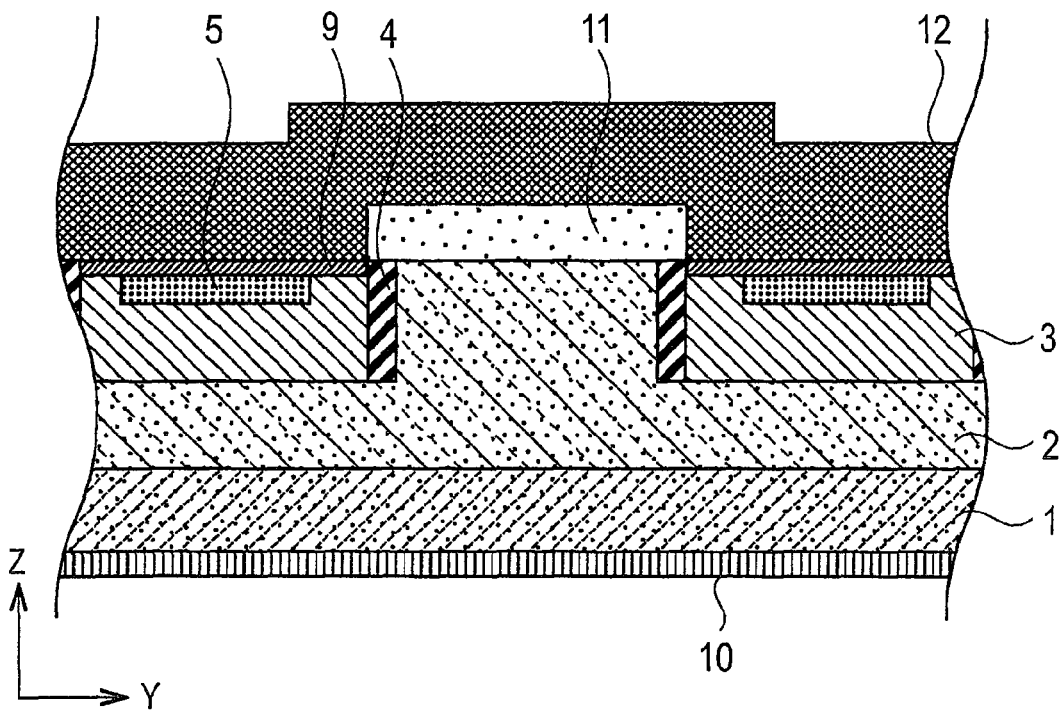
FIG. 31 is a cross-sectional view of C-C' cross section of a semiconductor device according to an eighth embodiment of the present invention.

FIG. 31 shows a cross-sectional configuration of C-C' cross section of the semiconductor device according to the eighth embodiment of the present invention. The planer configuration of the semiconductor device, the cross-sectional configuration of the semiconductor device of A-A' cross-section thereof, and the cross-sectional configuration of the semiconductor device of B-B' cross-section thereof are the same as those of FIGS. 28, 30A, and 2B, respectively and are not shown.

The semiconductor device according to the eighth embodiment differs from the semiconductor device according to the fourth embodiment in that the Schottky electrodes 11 are patterned. Specifically, as shown in FIG. 28, the Schottky electrodes 11 have linear patterns parallel to each other and are located so as to be orthogonal to the linear patterns of the insulating gate portions (6 to 8). The Schottky electrodes 11 and ohmic electrodes 9 are alternately arranged in the direction that the insulating gate portions (6 to 8) extend.

As shown in FIGS. 30A and 30B, the Schottky electrodes 11 are not located on the ohmic electrodes 9. On the ohmic electrodes 9, the source electrode 12 is directly placed. The both ends of each Schottky electrode 11 overlap the respective first well regions 3.

With such a configuration, the source electrode 12 and ohmic electrodes 9 are in direct contact with each other, so that parasitic resistance between the source electrode 12 and source regions 5 is reduced.

The other configuration, operations, and manufacturing method are the same as those of the fourth embodiment, and the description thereof is omitted.

Ninth Embodiment

In a ninth embodiment, a description is given to a semiconductor device including hetero electrodes 15 instead of the Schottky electrodes 11 in the sixth embodiment. The hetero electrodes 15 form heterojunctions with part of the drift region 2 exposed in the major surface FS.

Figure 32:
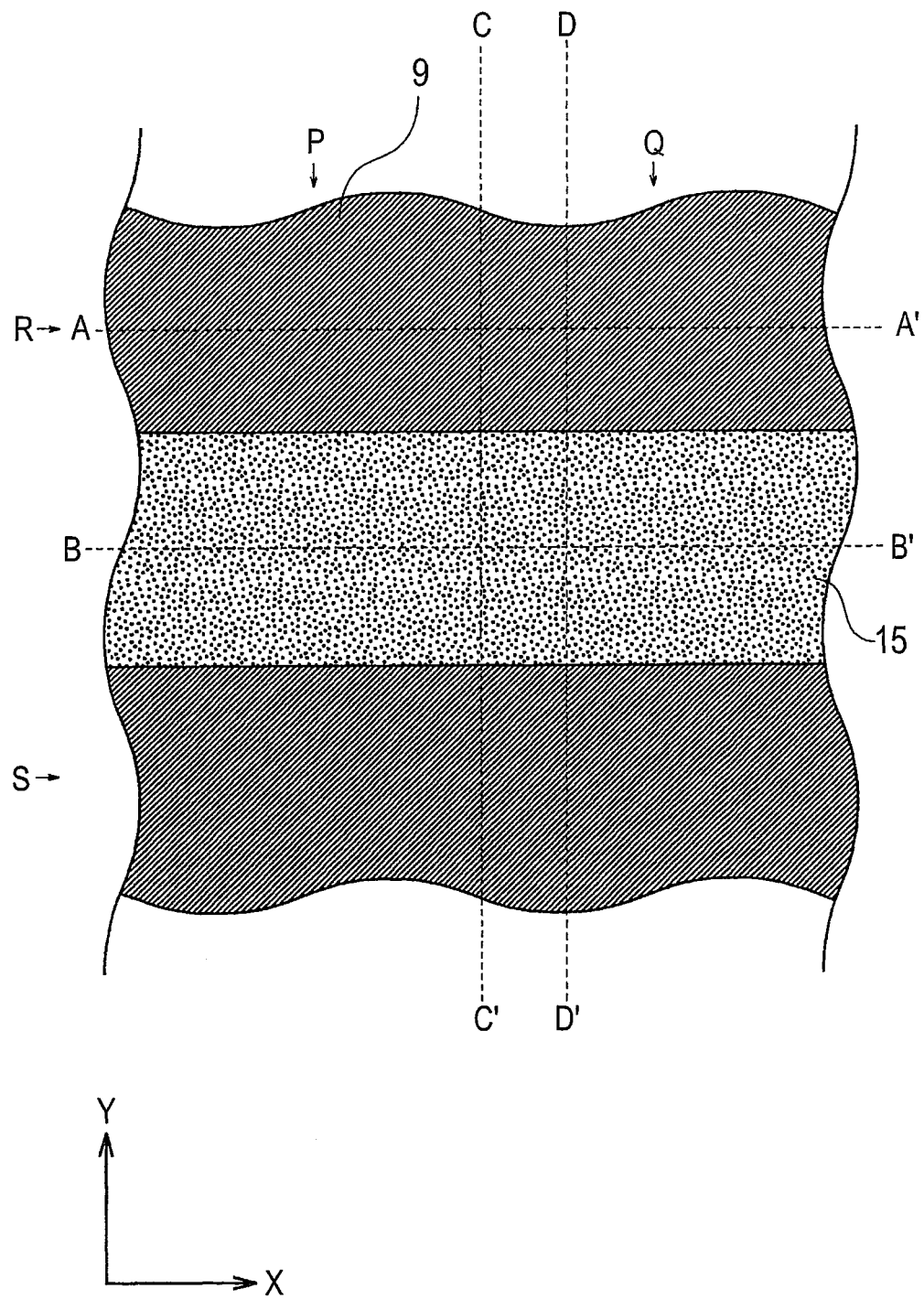
FIG. 32 is a plan view illustrating a configuration of a semiconductor device according to a ninth embodiment of the present invention.

FIG. 32 shows an arrangement of the ohmic electrodes 9 and hetero electrodes 15 when viewed in the normal direction of the major surface FS. The source electrode 12 is not shown.

The part between P and Q in FIG. 32 corresponds to a unit cell in the axis-X direction, and the part between R and S corresponds to the unit cell in the axis-Y direction. In the other part than the range shown in FIG. 32, the unit cells are repeated in the axis-X direction and axis-Y direction.

Figure 33A:
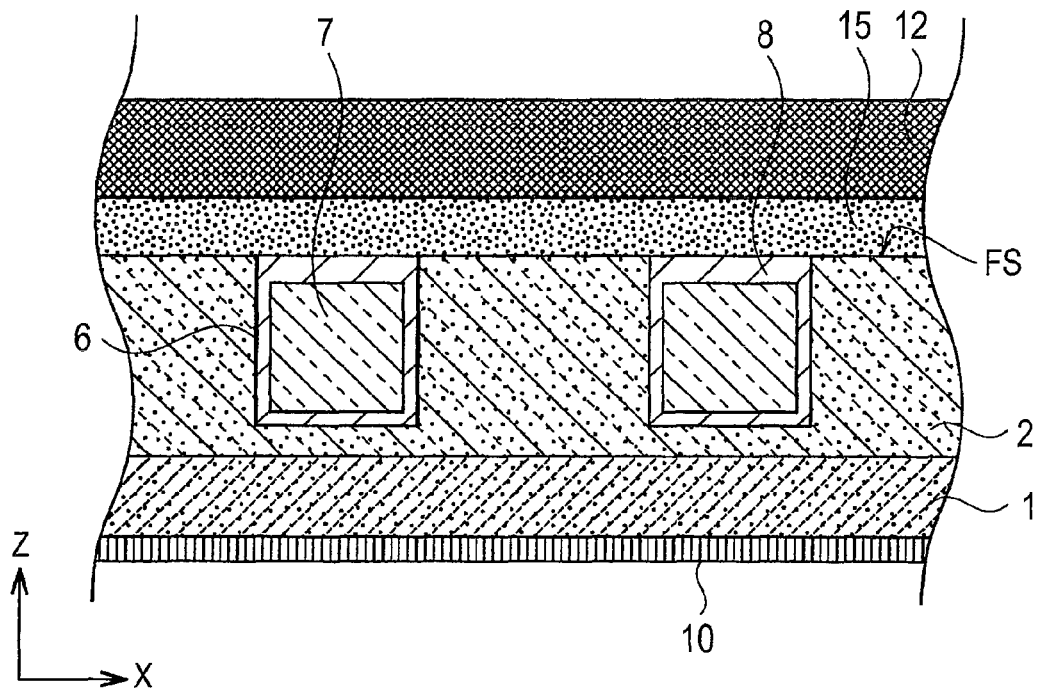
FIG. 33A is a cross-sectional view of B-B' cross section of the semiconductor device shown in FIG. 32.
Figure 33B:
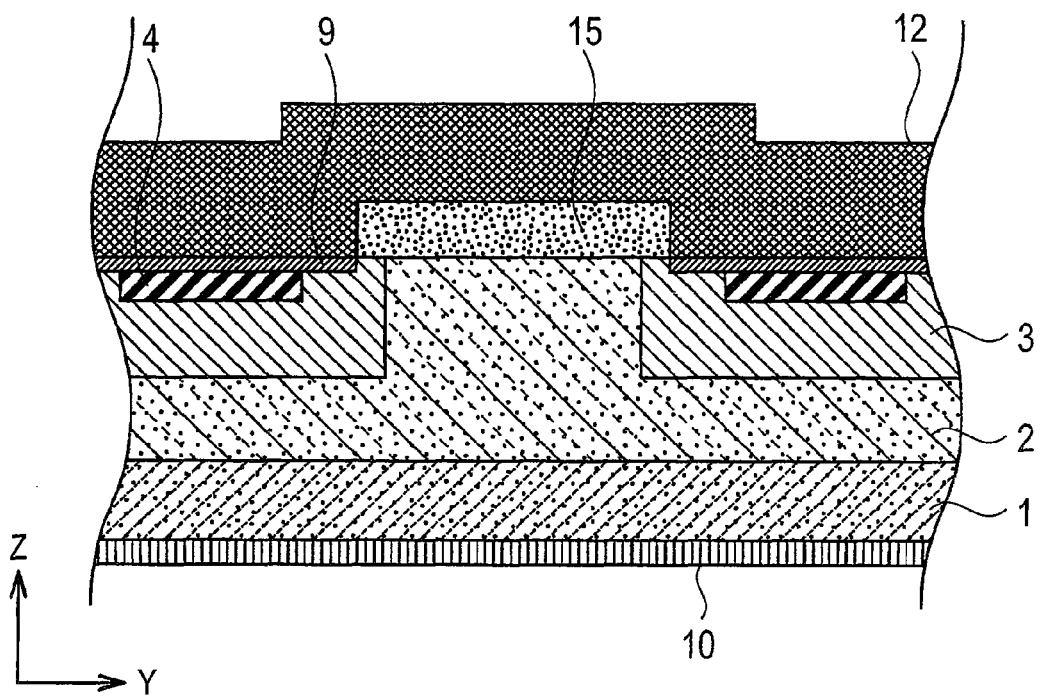
FIG. 33B is a cross-sectional view of C-C' cross section of the semiconductor device shown in FIG. 32.
Figure 33C:
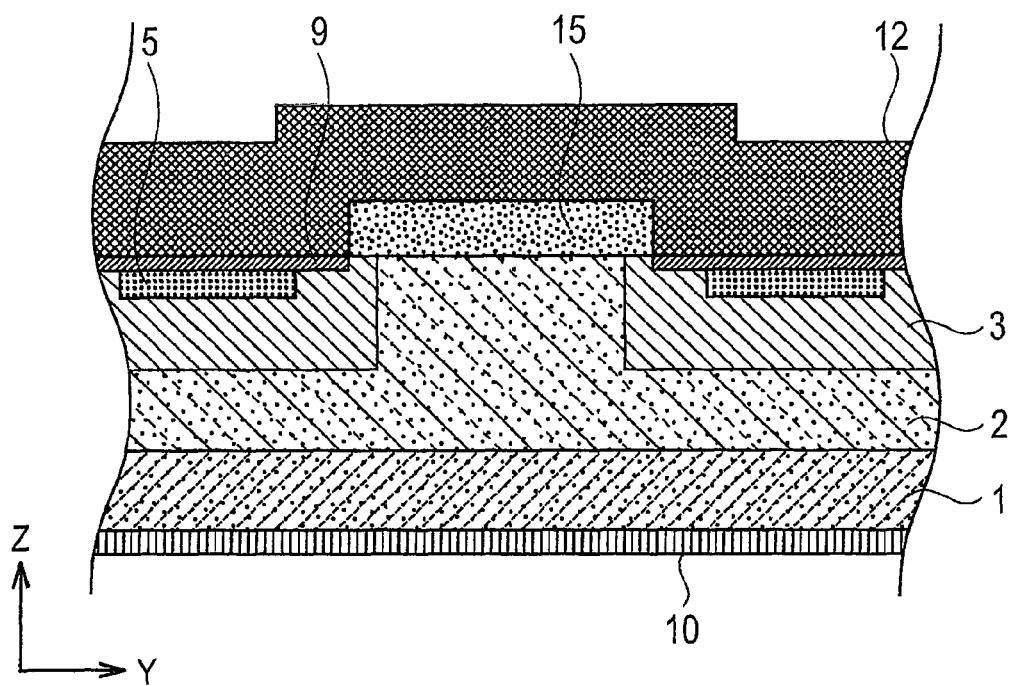
FIG. 33C is a cross-sectional view of D-D' cross section of the semiconductor device shown in FIG. 32.

FIG. 33A shows a cross-sectional configuration of B-B' cross section of the semiconductor device shown in FIG. 32. FIG. 33B shows a cross-sectional configuration of C-C' cross section of the semiconductor device shown in FIG. 32. FIG. 33C shows a cross-sectional configuration of D-D' cross section of the semiconductor device shown in FIG. 32. The cross-sectional configuration of the semiconductor device of A-A' cross-section of FIG. 32 is the same as FIG. 29A and is not shown.

As described above, the drift region 2 is made of silicon carbide (SiC). Moreover, the first main electrode (9, 15, and 12) includes: the ohmic electrodes 9 which are in ohmic contact with the well contact regions 4 and source regions 5; the hetero electrodes 15 which form heterojunctions with the drift region 2; and the source electrode 12 which is connected to the ohmic electrodes 9 and hetero electrodes 15.

The hetero electrodes 15 are made of a semiconductor having a narrower energy band gap than that of n−type silicon carbide constituting the drift region 2, for example, polycrystalline silicon (Si). In the heterojunction portions where the hetero electrodes 15 form heterojunctions with the drift region 2, heterojunction diodes (HJDs) are formed as another example of the unipolar diode.

It is generally known that when silicon carbide (SiC) and polycrystalline silicon (Si) are brought into contact with each other, an HJD having a rectifying characteristic is formed because of the difference in the energy band structure. Moreover, the on-voltage of the HJD can be controlled by the kind and concentration of the impurities implanted to the polycrystalline silicon.

As shown in FIG. 32, the hetero electrodes 15 have linear patterns orthogonal to the linear patterns of the insulating gate portions (6 to 8). The hetero electrodes 15 and ohmic electrodes 9 are alternately arranged in the direction that the insulating gate portions (6 to 8) extend.

As shown in FIG. 33A, the hetero electrodes 15 are directly placed on the major surface FS of the drift region 2. The drift region 2 and hetero electrodes 15 form heterojunctions to form HJDs.

As shown in FIGS. 33B and 33C, the hetero electrodes 15 are not located on the ohmic electrodes 9. On the ohmic electrodes 9, the source electrodes 12 is directly placed. The both ends of each hetero electrode 15 overlap the first well regions 3.

Next, with reference to FIGS. 34 to 37, a description is given of a method of manufacturing the semiconductor device according to the ninth embodiment of the present invention.

(1) First, the same processes as the first process shown in FIGS. 3 and 4 to the eighth process shown in FIGS. 16A and 16B of the first embodiment are performed.

Figure 34:
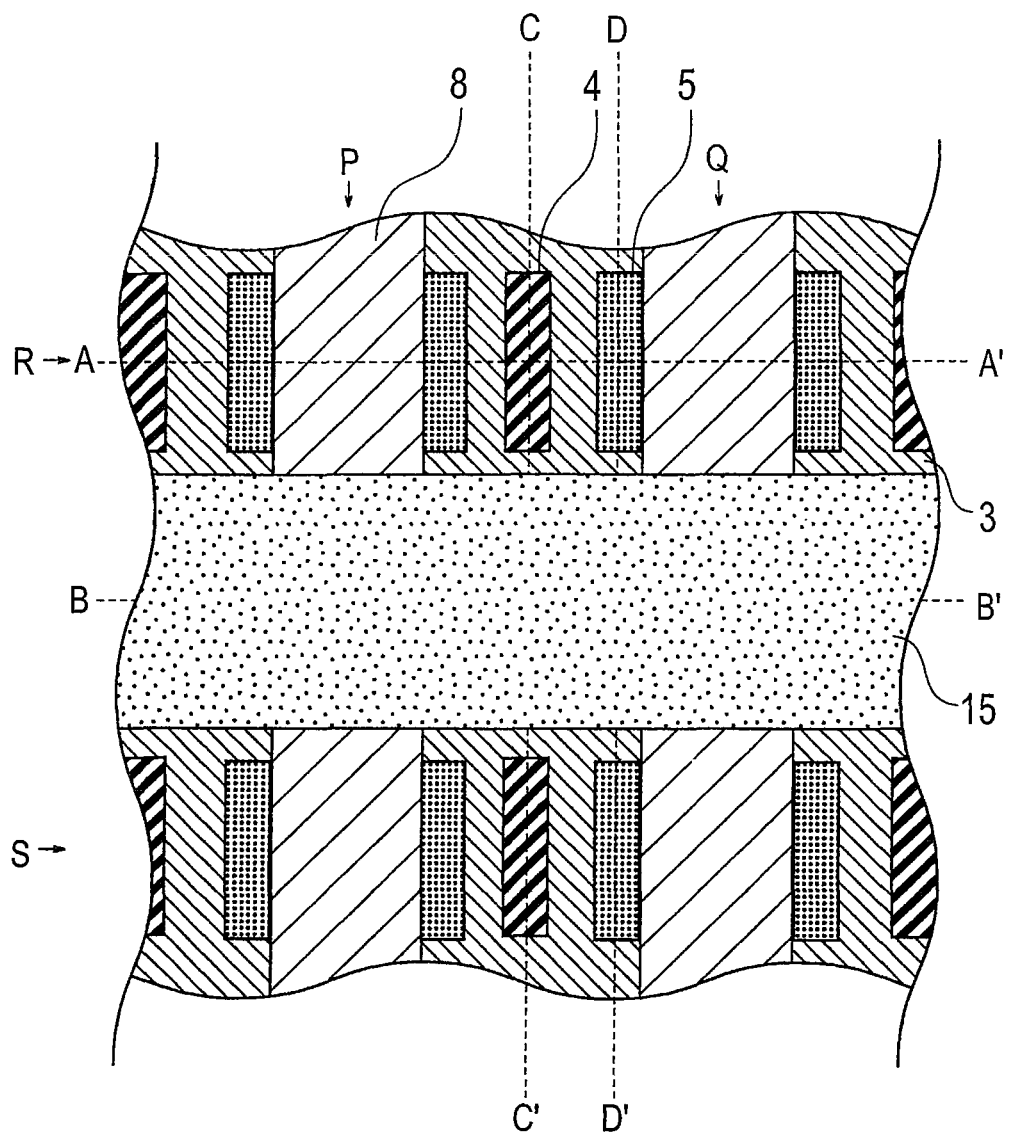
FIG. 34 is a plan view showing a ninety-first process of a method of manufacturing the semiconductor device according to the ninth embodiment of the present invention.
Figure 35:
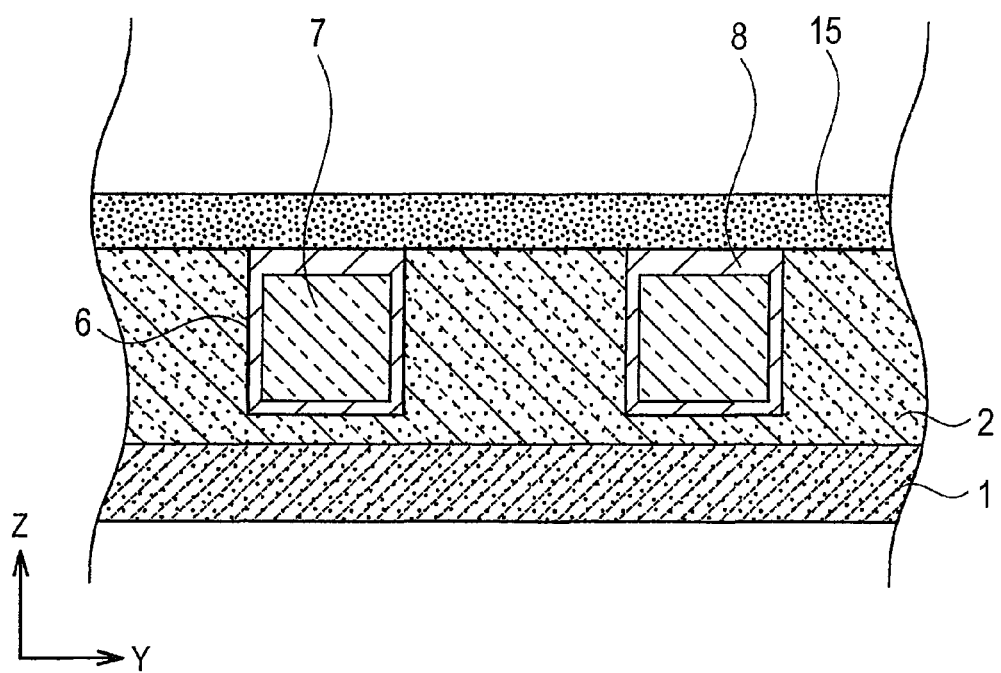
FIG. 35 is a cross-sectional view of B-B' cross section of the semiconductor device shown in FIG. 34.

(2) Next, as show in FIGS. 34 and 35, polycrystalline silicon 15 is deposited on the entire first major surface FS and patterned to the hetero electrodes 15 (ninety-first process). The patterning can be performed by dry or wet etching using a resist pattern as a mask, a lift off process, or the like. The resist can be patterned by photolithography.

FIG. 34 shows the ninety-first process in the method of manufacturing the semiconductor device according to the ninth embodiment of the present invention. FIG. 35 shows a B-B' cross section of the semiconductor device shown in FIG. 34. The cross-sectional configuration of the semiconductor device of A-A' cross-section of FIG. 34 is the same as that of FIG. 16A and is not shown.

(3) Next, the same process as the ninth process shown in FIGS. 17, 18A, and 18B is carried out (ninety-second process). Therefore, the ohmic electrodes 9, which is in ohmic contact with the well contact regions 4 and source regions 5, are formed, and the second main electrode 10, which is in ohmic contact with the major surface SS of the semiconductor substrate 1, is formed.

Figure 36:
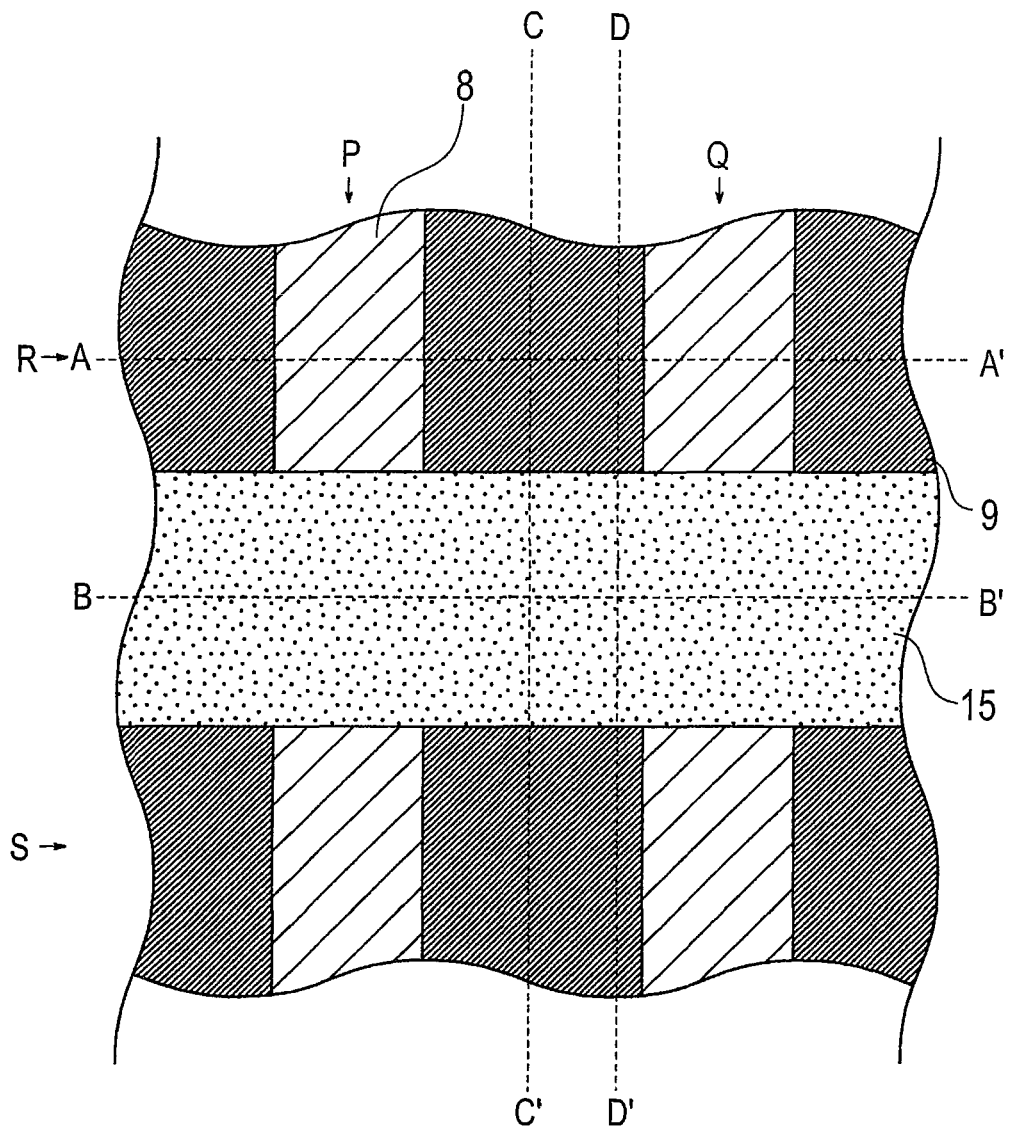
FIG. 36 is a plan view showing a ninety-second process of a method of manufacturing the semiconductor device according to the ninth embodiment of the present invention.
Figure 37:
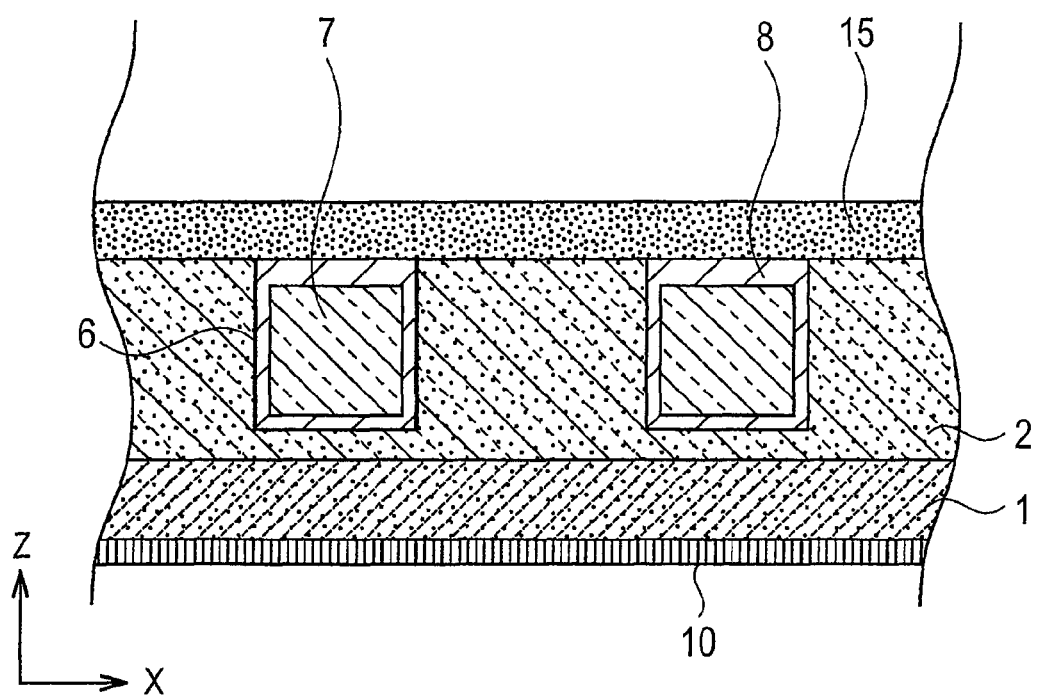
FIG. 37 is a cross-sectional view of B-B' cross section of the semiconductor device shown in FIG. 36.

FIG. 36 shows the ninety-second process in the method of manufacturing the semiconductor device according to the ninth embodiment of the present invention. FIG. 37 shows B-B' cross section of the semiconductor device shown in FIG. 36. The cross-sectional configuration of the semiconductor device of A-A' cross-section of FIG. 36 is the same as that of FIG. 18A and is not shown.

(4) Next, the source electrode 12 is deposited on the hetero electrodes 15 and ohmic electrodes 9 and is partially removed from regions including the outer periphery of the semiconductor device (ninety-third process). Through the above process, the semiconductor device shown in FIGS. 32 and 33A to 33C is completed.

As described above, according to the ninth embodiment of the present invention, the following operational effects can be obtained.

Before the ohmic electrodes 9 are formed (the ninety-second process), the hetero electrodes 15 constituting the HJDs are formed (the ninety-first process). In the first embodiment, annealing for alloying to form the ohmic electrodes is carried out in a state where the Schottky junction portions 13, at which the SBDs are to be formed, are exposed. On the contrary, in the ninth embodiment, the annealing for alloying to form the ohmic electrodes 9 is carried out in a state where the heterojunctions, at which HJDs are formed, are protected by the hetero electrodes (polycrystalline silicon) 15. Accordingly, compared to the first embodiment, the interfaces between the drift region 2 and the hetero electrodes (polycrystalline silicon) 15 can be kept cleaner, and the leak current when the semiconductor device is off can be further reduced. As the leak current is reduced, the barrier height of the heterojunctions can be set lower. The semiconductor device can incorporate a HJD with a low on-resistance.

The other configuration, operations, and manufacturing method are the same as those of the sixth embodiment, and the description thereof is omitted.

Second Modification

The configuration described in the second embodiment in which the channel length in the axis-Y direction is longer than the channel length in the axis-Z direction can be applied to the configuration of the ninth embodiment. The threshold voltage for channel formation in the direction (axis-Z direction) parallel to the normal of the major surface FS of the drift region 2 can be set higher than the threshold voltage for channel formation in the direction (axis-Y direction) vertical to the normal of the major surface FS of the drift region 2. Accordingly, it is possible to prevent the on-current flowing through each channel from being concentrated on the narrow region (L3 portion), thus providing a semiconductor device with high breakdown resistance, reliability, and yield.

Moreover, the configuration described in the third embodiment, in which the well contact regions 4 and source contact regions 5 are linearly located in parallel to the axis X, may be applied to the configuration of the ninth embodiment. The structure of the first well regions 3, well contact regions 4, and source regions 5 is therefore uniform in the axis-X direction. Accordingly, the distance between each pair of adjacent insulating gate portions (6 to 8) can be further reduced.

Moreover, it is unnecessary to precisely align the insulating gate portions (6 to 8) with not only the first well regions 3 but also the well contact regions 4 and source regions 5. Accordingly, the reduction in yield due to misalignment can be further prevented.

Figure 23B:
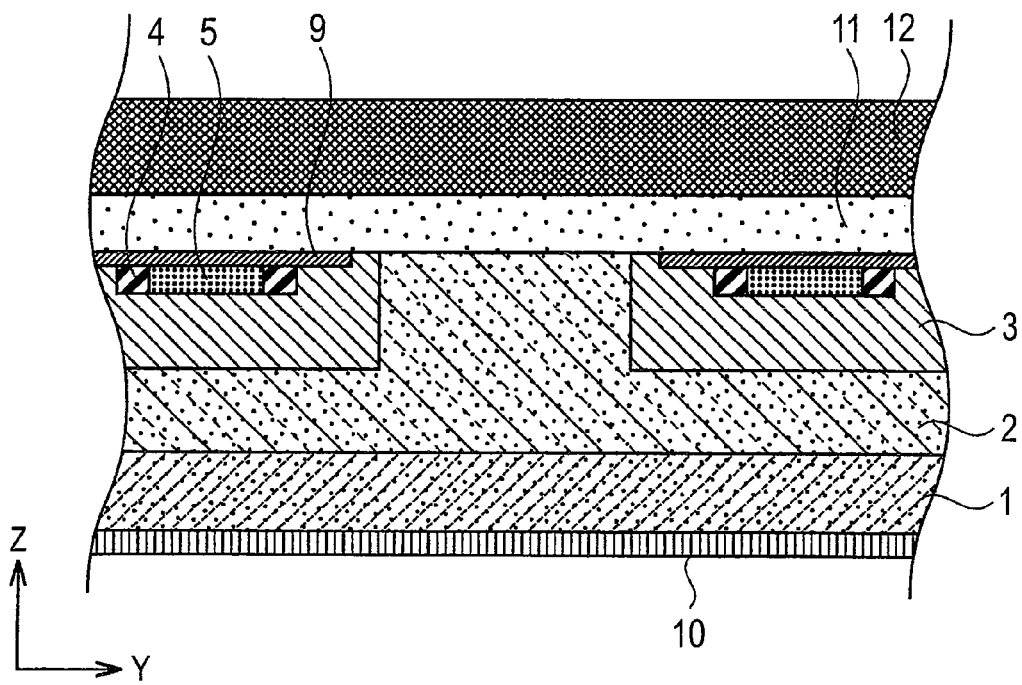
FIG. 23B is a cross-sectional view of C-C' cross section of the semiconductor device shown in FIG. 22A.

Moreover, the p+ type well contact regions 4 are formed in the channel portions parallel to the axis-Y direction, which is shown in FIG. 23B. Accordingly, the threshold voltage is high in the channel portions parallel to the axis-Y direction. It is therefore possible to prevent the on-current flowing through each channel from being concentrated on the narrow region (L3 portion), thus providing a semiconductor device with high breakdown resistance, reliability, and yield.

The configuration described in the fourth embodiment, in which the p+ type well contact regions 4, that are added with higher concentration of p type impurities than that of the first well regions 3, are located at the boundaries between the drift region 2 and the first well regions 3, may be applied to the configuration of the ninth embodiment. As shown in FIG. 25, this can form a JBS structure in which the two well contact regions 4 sandwich the drift region 2, thus increasing the width of the depletion layers extending from the two well contact regions 4 into the drift region 2. Accordingly, the effect on reducing the electric field at each heterojunction interface can be more pronounced, and the leak current flowing through the HJDs when the MOSFET is off can be further reduced. As the leak current is reduced, the barrier height of the heterojunctions of the HJDs can be set lower. The semiconductor device can incorporate HJDs with lower on-resistance.

Furthermore, the p+ type well contact regions 4 are formed in the channel portions parallel to the axis-Y direction, which is shown in FIG. 25. Accordingly, the threshold voltage is high in the channel portions parallel to the axis-Y direction. It is therefore possible to prevent the on-current flowing through each channel from being concentrated on the narrow regions, thus providing a semiconductor device with high breakdown resistance, reliability, and yield.

The plural well contact regions 4 have linear patterns intersecting with the insulating gate portions (6 to 8). The plural source regions 5 include linear patterns intersecting with the insulting gate portions (6 to 8). The structure of the first well regions 3, well contact regions 4, and source regions 5 is uniform in the axis-X direction. Accordingly, the distance between each pair of adjacent insulating gate portions (6 to 8) can be further reduced.

Moreover, it is unnecessary to precisely align the insulating gate portions (6 to 8) to not only the first well regions 3 but also the well contact regions 4 and source regions 5. Accordingly, the reduction in yield due to misalignment can be further prevented.

Furthermore, the configuration described in the ninth embodiment further includes the p type second well regions 14 (described in the fifth embodiment), which are located at the boundaries between the insulating gate portions (6 to 8) and the drift region 2 and are connected to the first main electrode (9, 15, and 12). As shown in FIG. 27, this forms a JBS structure also in the cross section vertical to the direction that the insulating gate portions (6 to 8) extend. Accordingly, compared with the first embodiment, the effect on reducing the electric field at the heterojunction interfaces can be more pronounced, and the leak current flowing through the HJDs when the MOSFET is off can be further reduced.

Hereinabove, the basic structures of the semiconductor devices according to the first to ninth embodiments (structures of the unit cells in the X and Y directions) are described. At the outermost periphery of the semiconductor chip, where plural unit cells are connected in parallel, a termination structure such as a guard ring is employed. Such termination structure can reduce the concentration of electric field on the periphery when the field effect transistor (FET) is off and implement high breakdown resistance of the semiconductor device. It is also possible to apply termination structures generally used in the power device field to the semiconductor devices according to the first to ninth embodiments, and drawings and description thereof are omitted.

Other Embodiments

As described above, the present invention is described using the nine embodiments and the modifications thereof. However, it should be understood that the present invention is not limited by the description and drawings constituting a part of the disclosure. From this disclosure, various substitutions, example, and operational techniques will be apparent to those skilled in the art. It should be understood that the present invention includes various embodiments and the like not described herein.

In the description of the first to ninth embodiments, the materials of the semiconductor substrate 1 and drift regions 2 are silicon carbide as an example but may be other semiconductor materials such as silicon (Si), gallium arsenide (GaAs), gallium nitride (GaN), and diamond.

The description is given of the trench-type MOSFETs, but the present invention can be applied to MOSFETs of planer type or other configuration.

This application claims priority from Japanese Patent Application 2010-102913, filed Apr. 28, 2010, which is incorporated herein by reference in its entirety.

INDUSTRIAL APPLICABILITY

According to the semiconductor device of the present invention, the plural insulating gate portions have linear patterns parallel to each other when viewed in the normal direction of the major surface of the drift region. Between the adjacent insulating gate portions, the junction portions at which the first main electrode forms junctions with the drift regions and the first well regions are arranged along the direction that the insulating gate portions extend. This can make it possible to reduce the distances between the adjacent insulating gate portions and thereby miniaturize the semiconductor device. The semiconductor device according to the present invention is industrially applicable.

The invention claimed is:

1. A semiconductor device, comprising:
a semiconductor substrate;
a drift region of first conductivity type which is provided on the semiconductor substrate;
a plurality of first well regions of second conductivity type which are provided within the drift region and are partially exposed in a major surface of the drift region;
a plurality of source regions of the first conductivity type which are located within the first well regions and are partially exposed in the major surface;
three or more insulating gate portions which form channels reversed to the first conductivity type in part of the first well regions located between the drift region and source regions; and
a first main electrode which forms a contact with the drift region exposed in the major surface to constitute a unipolar diode and is connected to the first well regions and the source regions, wherein
the plurality of insulating gate portions have linear patterns parallel to each other when viewed in the normal direction of the major surface,
between each pair of adjacent insulating gate portions, the first well regions and junction portions in which the first main electrode forms junctions with the drift region are arranged along the direction that the insulating gate portions extend, and the first well regions and the junction portions in which the first main electrode form junctions with the drift region are arranged in line along a direction vertical to the direction that the insulating gate portions extend,
the channels are formed in the normal direction of the major surface and in the vertical direction to the normal of the major surface, and
a length of the channels formed in the vertical direction to the normal of the major surface is longer than a length of the channels formed in the normal direction of the major surface.

2. The semiconductor device according to claim 1, wherein the first well regions are located on an upper part of the drift region, the source regions are located on an upper part of the first well regions, the first main electrode is located on the major surface of the drift region, and the distance between each source region and the drift region in the direction vertical to the normal of the major surface is longer than the distance between the source region and the drift region in the normal direction of the major surface.

3. The semiconductor device according to claim 1, wherein distance between each pair of the first well regions adjacent to each other along the direction that the insulating gate portions extend is set to a distance which allows depletion layers extending from edges of the pair of adjacent first well regions to the drift region to overlap each other when a predetermined voltage is applied across the drift region and the first main electrode in a direction opposite to a forward direction of the unipolar diode.

4. The semiconductor device according to claim 1, further comprising a well contact region which is formed in part of each channel extending along the direction vertical to the normal of the major surface and has a higher concentration of impurities of the second conductivity type than that of the first well regions.

5. The semiconductor device according to claim 1, further comprising a plurality of well contact regions of the second conductivity type which are located in places different from the source regions within the first well regions and are partially exposed in the major surface to be connected to the first main electrode, wherein the plurality of well contact regions intersect with the direction that the insulating gate portions extend and have linear patterns parallel to each other.

6. The semiconductor device according to claim 5, wherein the well contact regions are located at boundaries between the drift region and the first well regions.

7. The semiconductor device according to claim 5, wherein the plurality of source regions have linear patterns which intersect the direction that the insulating gate portions extend and are parallel to each other.

8. The semiconductor device according to claim 1, further comprising second well regions of the second conductivity type which are located at boundaries of the insulating gate portions and drift region and are connected to the first main electrode.

9. The semiconductor device according to claim 1, wherein the drift region is made of silicon carbide, and the first main electrode includes a Schottky electrode which forms a Schottky junction with part of the drift region exposed in the major surface, and the unipolar diode is a Schottky barrier diode.

10. The semiconductor device according to claim 1, wherein the drift region is made of silicon carbide,
the first main electrode includes a hetero electrode,
the hetero electrode is made of a semiconductor having a narrower energy band gap than that of the drift region, and
the unipolar diode is a heterojunction diode.

11. The semiconductor device according to claim 1, wherein the unipolar diode operates with lower on-voltage than on-voltage of PN diodes formed between the drift region and the first well regions or between the first well regions and the source regions.

* * * * *